(12) United States Patent
Liu et al.

(10) Patent No.: US 10,510,800 B2
(45) Date of Patent: Dec. 17, 2019

(54) DEVICE COMPRISING A LIGHT-EMITTING DIODE AND A SCHOTTKY BARRIER DIODE RECTIFIER, AND METHOD OF FABRICATION

(71) Applicant: The Penn State Research Foundation, University Park, PA (US)

(72) Inventors: Jie Liu, State College, PA (US); Jian Xu, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 16/072,008

(22) PCT Filed: Feb. 8, 2017

(86) PCT No.: PCT/US2017/016888
§ 371 (c)(1),
(2) Date: Jul. 23, 2018

(87) PCT Pub. No.: WO2017/139300
PCT Pub. Date: Aug. 17, 2017

(65) Prior Publication Data
US 2019/0035844 A1 Jan. 31, 2019

Related U.S. Application Data

(60) Provisional application No. 62/293,057, filed on Feb. 9, 2016.

(51) Int. Cl.
*H01L 27/11568* (2017.01)
*H01L 27/15* (2006.01)
(Continued)

(52) U.S. Cl.
CPC .......... *H01L 27/15* (2013.01); *H01L 29/2003* (2013.01); *H01L 29/66212* (2013.01); *H01L 29/812* (2013.01); *H01L 29/872* (2013.01)

(58) Field of Classification Search
CPC .............. H01L 25/0753; H01L 33/504; H04B 33/0806; H03J 1/187; H03K 2217/0009; H03K 2217/0045; H03K 2217/0081
See application file for complete search history.

(56) References Cited

U.S. PATENT DOCUMENTS 3,706,128 A * 12/1972 Heer ...................... H01L 21/00
438/582
7,009,199 B2 * 3/2006 Hall ..................... H01L 25/0753
257/101
(Continued)

OTHER PUBLICATIONS

Electronics Notes website, "Schottky Diode: Schottky Barrier Diode", https://www.electronics-notes.com/articles/electronic_components/diode/schottky-barrier-diode.php, date accessed Jul. 18, 2019, 3 pages (Year: 2019).*

(Continued)

*Primary Examiner* — Earl N Taylor
(74) *Attorney, Agent, or Firm* — Buchanan Ingersoll & Rooney PC

(57) ABSTRACT

An integrated circuit is provided with a (bridge) rectifier circuit configured to couple to an alternating current (AC) supply to a (string of) LEDs monolithically fabricated on substrate, preferably on a patterned sapphire substrate (PSS). The rectifier including at least one schottky barrier diode configured to have a reverse-bias breakdown voltage substantially equal to or greater than half a peak voltage of the AC supply. Further embodiments include a method for fabricating an integrated Schottky barrier diode (SBD) with a LED on a LED wafer. Some embodiments can include etching processes to a wafer that may include a plurality of processing cycles. Some embodiments can further include a wafer having a patterned substrate. The wafer with the (Continued)

patterned substrate may have an interface layer configured to facilitate increasing a forward bias current density of the SBD.

11 Claims, 22 Drawing Sheets

(51) Int. Cl.
*H01L 29/66* (2006.01)
*H01L 29/812* (2006.01)
*H01L 29/872* (2006.01)
*H01L 29/20* (2006.01)

(56) References Cited

U.S. PATENT DOCUMENTS

| | | | | |
|---|---|---|---|---|
| 7,221,044 | B2* | 5/2007 | Fan | H01L 27/153 |
| | | | | 257/676 |
| 7,855,388 | B2* | 12/2010 | Yen | H05B 33/0803 |
| | | | | 257/79 |
| 8,304,787 | B2* | 11/2012 | Chang | H01L 27/156 |
| | | | | 257/88 |
| 2007/0131942 | A1* | 6/2007 | Yen | H05B 33/0803 |
| | | | | 257/79 |
| 2008/0017871 | A1* | 1/2008 | Lee | H01L 25/0753 |
| | | | | 257/88 |
| 2008/0106212 | A1* | 5/2008 | Yen | H05B 33/0803 |
| | | | | 315/192 |
| 2008/0179602 | A1* | 7/2008 | Negley | H01L 21/2654 |
| | | | | 257/88 |
| 2009/0096386 | A1* | 4/2009 | Yeh | H01L 25/0753 |
| | | | | 315/294 |
| 2010/0096977 | A1* | 4/2010 | Lee | F21K 9/00 |
| | | | | 313/503 |
| 2010/0308347 | A1* | 12/2010 | Yeh | H01L 27/156 |
| | | | | 257/88 |
| 2010/0308348 | A1* | 12/2010 | Chang | H01L 27/156 |
| | | | | 257/88 |
| 2011/0059559 | A1* | 3/2011 | Yen | H05B 33/0803 |
| | | | | 438/28 |
| 2011/0062891 | A1* | 3/2011 | Chen | H01L 27/156 |
| | | | | 315/294 |
| 2011/0074305 | A1* | 3/2011 | Yeh | H01L 25/0753 |
| | | | | 315/253 |
| 2012/0049216 | A1* | 3/2012 | Ting | H01L 25/0753 |
| | | | | 257/98 |
| 2013/0034919 | A1* | 2/2013 | Chyi | H01L 27/15 |
| | | | | 438/23 |
| 2013/0214693 | A1* | 8/2013 | Huang | H01L 27/15 |
| | | | | 315/201 |
| 2019/0035844 | A1* | 1/2019 | Liu | H01L 27/15 |

OTHER PUBLICATIONS

ETchnophiles website, "Difference between diode, Zener diode, and Schottky Diode", https://etechnophiles.com/difference-diode-zener-diode-schottky-diode/, date accessed Jul. 18, 2019, 14 pages (Year: 2019).*
Electronics Tutorials website, "The Schottky Diode", https://www.electronics-tutorials.ws/diode/schottky-diode.html, date accessed Jul. 18, 2019, 9 pages (Year: 2019).*
International Search Report and Written Opinion for PCT/US2017/016888 filed Feb. 8, 2017, dated Apr. 3, 2017.

* cited by examiner

DEVICE COMPRISING A LIGHT-EMITTING DIODE AND A SCHOTTKY BARRIER DIODE RECTIFIER, AND METHOD OF FABRICATION

CROSS-REFERENCE TO RELATED APPLICATIONS

The present application is the U.S. national stage application under 35 U.S.C. § 371 for International Patent Application No. PCT/US2017/016888, filed on Feb. 8, 2017, which claims priority to U.S. Provisional Patent Application No. 62/293,057, which was filed on Feb. 9, 2016, and the entire contents of each is incorporated herein by reference.

FIELD OF THE INVENTION

The present application relates to techniques for fabricating semiconductor devices. Some embodiments disclosed in the application can relate to techniques for monolithically integrating a light emitting diode LED and Schottky barrier diode SBD on a wafer.

BACKGROUND OF THE INVENTION

Some light emitting diodes (LEDs) can be fabricated on gallium nitride (GaN) wafers. A conventional GaN LED may emit light when a direct current (DC) voltage is applied in one direction across the LED's terminals (e.g., from the LED's anode to its cathode) but not when the DC voltage is applied in the opposite direction across the LED's terminals (e.g., from the LED's cathode to its anode). DC supply voltages on the order of 3 V-5 V may be sufficient to activate some conventional GaN LEDs. In systems that use conventional GaN LEDs as light sources, a DC supply voltage suitable for activating an LED may be provided by a driving circuit, which can convert an alternating current (AC) supply voltage (e.g., a main AC supply voltage of 110V-240V) into the desired DC supply voltage.

SUMMARY OF THE INVENTION

According to an aspect of the present disclosure, an integrated circuit can be generated. An embodiment of the integrated circuit may include a rectifier circuit configured to couple to an AC supply. An embodiment of the rectifier circuit may include at least one diode having a reverse-bias breakdown voltage substantially equal to or greater than half a peak voltage of the AC supply. An embodiment of the integrated circuit may further include one or more light emitting diodes (LEDs) coupled to the rectifier circuit.

According to an aspect of the present disclosure, an embodiment of the integrated circuit can include a LED wafer having a substrate. The substrate may be a gallium nitride (GaN) substrate. For example, one or more LEDs may be formed on the GaN substrate to generate the LED wafer. One or more Schottky barrier diodes (SBDs) may be formed on the substrate. This may include forming one or more SBDs on the same substrate that the LED wafer is formed on. In some embodiments, at least one LED and at least one SBD can be formed on the substrate of the LED wafer can generate an integrated LED-SBD. The LED-SBD may be configured as an AC-powered LED (AC LED). This may include configuring the integrated LED-SBD as a rectifier circuit coupled to an AC power supply. In some embodiments, the integrated circuit can include at least one integrated LED-SBD. In at least one embodiment the integrated LED-SBD can be used to form a light source.

According to an aspect of the present disclosure, a method of processing or fabricating an AC LED on a LED wafer may include etching at least a portion of the LED wafer to expose a portion of a buffer layer and a portion of an n-type layer. In some embodiments, the buffer layer may be an undoped GaN layer. In some embodiments, the n-type layer may be an n-type GaN layer. Embodiments of the method may further include annealing and/or passivating at least a portion of the LED wafer. Embodiments of the method may further include depositing an Ohmic material on the n-type layer. Embodiments of the method may further include depositing a Schottky material on the buffer layer.

According to an aspect of the present disclosure, a method of etching the LED wafer can include performing at least one processing cycle. This may include growing an oxide layer on a portion of the n-type layer of the LED wafer. In some embodiments, the oxide layer can be a gallium oxide layer ($Ga_2O_3$). Embodiments of the method can further include etching the wafer to remove the oxide.

Some embodiments can include an integrated circuit. The integrated circuit can include a rectifier circuit that may be configured to be couple to an alternating current (AC) supply. The rectifier circuit may include at least one diode having a reverse-bias breakdown voltage substantially equal to or greater than half a peak voltage of the AC supply. The integrated circuit may include at least one light emitting diode (LED) coupled to the rectifier circuit. In some embodiments, rectifier circuit can be configured to form a bridge circuit with the AC supply. In some embodiments, the bridge circuit may include a Wheatstone bridge circuit. In some embodiments, an arm of the bridge circuit comprises the at least one diode. In some embodiments, the integrated circuit can include a substrate on which the rectifier circuit and the at least one LED may be formed. In some embodiments, the substrate can include at least one of a gallium nitride (GaN) substrate and a sapphire substrate. In some embodiments, the at least one diode can include a Schottky barrier diode (SBD). In some embodiments, the substrate can be a patterned sapphire substrate with an interface layer on the patterned sapphire substrate. The interface layer may be configured to increase a forward bias current density of the at least one diode.

Some embodiments can include an integrated circuit including a substrate that may be made from at least one of gallium nitride (GaN) and sapphire. The integrated circuit may include at least one light-emitting diode (LED) formed on the substrate. The integrated circuit may include at least one Schottky barrier diode (SBD) formed on the substrate. In some embodiments, the at least one LED and the at least one SBD can be monolithically integrated on the substrate. In some embodiments, the substrate can be a patterned sapphire substrate with an interface layer on the patterned sapphire substrate. The interface layer may be configured to increase a forward bias current density of the at least one SBD.

Some embodiments can include a method of processing an alternating current light emitting diode (AC LED) on a wafer. The wafer may include a substrate, a buffer layer and/or an n-type layer. The method may include etching at least a portion of the wafer. This may include etching to expose at least a portion of the buffer layer and/or at least a portion of an n-type layer. The method may further include at least one of annealing and passivating at least a portion of the wafer. The method may further include depositing an Ohmic material on at least a portion of the n-type layer. The method may further include depositing a Schottky material on at least a portion of the buffer layer. In some embodiments, the substrate can be a gallium nitride (GaN) substrate. In some embodiments, the substrate can be a patterned sapphire substrate.

In some embodiments, the etching at least a portion of the wafer to expose at least the portion of the buffer layer can further include performing at least one cycle of processing. The at least one cycle of processing can include growing a layer of an oxide on at least a portion of the n-type layer. The at least one cycle of processing can include etching at least a portion of the wafer. This may include etching at least a portion of the wafer to remove at least a portion of the oxide.

In some embodiments, the oxide may include gallium oxide. In some embodiments, the oxide can be grown by oxidizing at least a portion of the n-type layer. The method may further include photo-chemically treating at least a portion of the wafer from which the oxide was removed.

In some embodiments, the wafer can be an LED wafer. In some embodiments, the depositing the Ohmic material on at least a portion of the n-type layer and/or the depositing a Schottky material on at least a portion of the buffer layer can generate at least one Schottky barrier diode (SBD). In some embodiments an interface layer can be formed on the substrate. The interface layer may be configured to increase a forward bias current density of the SBD.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

The above and other objects, aspects, features, advantages and possible applications of the present innovation will be more apparent from the following more particular description thereof, presented in conjunction with the following drawings. Like reference numbers used in the drawings may identify like components. Various aspects and embodiments of the technology will be described with reference to the following figures. It should be appreciated that the figures are not necessarily drawn to scale.

FIG. 9A is a schematic of a conventional LED epi-wafer, FIG. 9B is a schematic of a conventional planar GaN metal-semiconductor-field-effect-transistor, FIG. 9C illustrates a structure of a GaN Schottky diode, and FIG. 9D illustrates Ohmic contacts on an undoped GaN layer of a GaN Schottky diode.

DETAILED DESCRIPTION OF THE INVENTION

Figure 1:
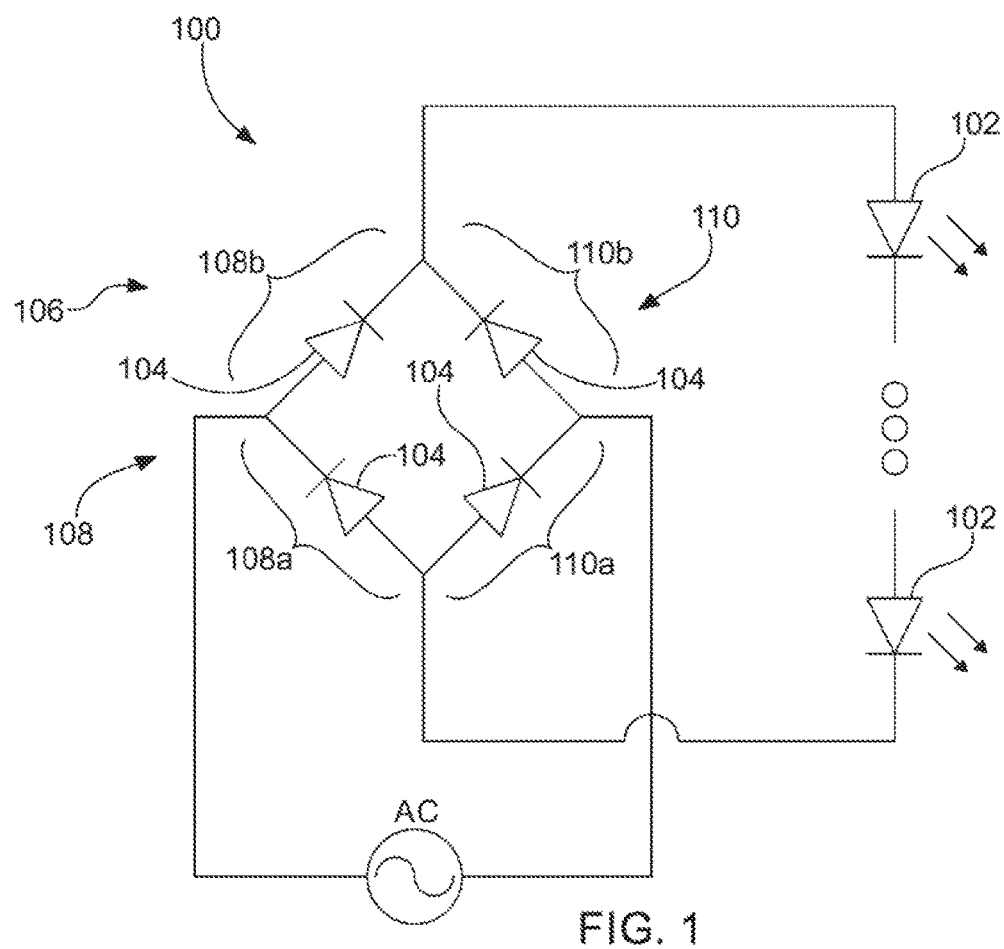
FIG. 1 is a schematic of an embodiment of an AC LED circuit, according to some embodiments.

The following description is of exemplary embodiments that are presently contemplated for carrying out the present invention. This description is not to be taken in a limiting sense, but is made merely for the purpose of describing the general principles and features of the present invention. The scope of the present invention is not limited by this description.

There can be several disadvantages associated with using a driving circuit to convert an AC supply voltage into a DC supply voltage for a LED light source. One may be that voltage conversion can introduce power loss. For example, the power conversion efficiency for some conventional LED driving circuits may be as low as 80%. Another disadvantage may be that electrical components of the driving circuit can increase the overall cost of a conventional LED light source. In recent years, the price of LED chips (e.g., GaN LED chips) has decreased more rapidly than the price of conventional electrical components. As a result, the driving circuit's share of the overall cost of an LED light source is likely to increase as the price of LED chips continues to fall. In addition, the lifetime of a driving circuit's electrical components may be much shorter than the lifetime of an LED chip. Thus, in LED light sources that use driving circuits, the lifetime of the LED light source is likely to be limited by the driving circuit's electrical components, rather than the longer lifetime of the LED chip. These disadvantages of the LED driving circuit can act as important obstacles to commercializing LED light sources.

Thus, development of AC LEDs that do not rely on conventional AC-DC driving circuits may overcome an important obstacle to the commercialization of LED light sources. One example of an AC LED can be a structure in which two LED arrays are connected together as a parallel circuit in opposite directions. This may include the anode of each LED array being connected to the cathode of the other LED array. Each array can include one or more series-connected single LEDs. Another example of an AC LED can be a structure in which several pairs of LEDs are connected together in series. In each LED pair, two LEDs can be connected in parallel in opposite directions. In both of these anti-parallel AC LED designs, when the devices are operated under an AC power supply, only half of the LEDs may emit light during positive half-cycles of the AC power supply, and the other half of the LEDs may emit light during negative half-cycles of the AC power supply. Compared to conventional DC-powered LEDs (DC LEDs) with the same light output, the chip area devoted to the anti-parallel AC LEDs may be twice as large as the chip area devoted to the DC LEDs.

Another example of an AC LED can be a structure in which SBDs and one or more LEDs may be connected together to form a Wheatstone bridge (WB). This may include forming a WB circuit on a same wafer. With the SBDs on the arms of the WB circuit, each individual LED may emit light during both halves of the AC period. The performance of the SBD-LED structure may depend on the breakdown voltage and/or forward-biased voltage drop of a SBD. For example, SBD-LED structures may perform well when the SBD has a relatively high breakdown voltage (e.g., 120 Volts (V) or more and a relatively low forward biased voltage drop (e.g., 5 V or less).

The inventors have recognized and appreciated that it may be difficult to fabricate an SBD with high breakdown voltage on an LED wafer. A commercially available LED wafer may consist of a sapphire substrate layer, an un-doped GaN buffer layer, an n-type GaN layer, an indium gallium nitride/gallium nitride (InGaN/GaN) multiple quantum well (MQW) active layer, and a p-type GaN layer. A Schottky contact may be formed on the n-type GaN layer or the un-doped GaN buffer layer. To expose these two layers for Schottky contact deposition, a conventional dry etching process may be employed to etch away the p-type GaN and MQW active layers, but this process may produce significant etching defects in the wafer. As a result, the breakdown voltage of an SBD fabricated on an LED wafer with a conventional dry etching process may be as low as approximately 15 V (e.g., for an SBD with the Schottky contact formed on the n-type GaN layer) or approximately 25 V (e.g., for an SBD with the Schottky contact formed on the GaN buffer layer).

Another technique for fabricating an SBD integrated AC LED may involve growing a rectifying layer on the LED wafer by epitaxy or deposition. This may include growing a rectifying layer of intrinsic semiconductor aluminum gallium nitride (AlGaN) on the LED wafer by epitaxy or deposition. Another technique for fabricating an SBD integrated AC LED may involve forming the rectifying region by introducing an n-type dopant on the top p-type GaN layer of the LED wafer via ion implantation or a diffusion technique. Yet another technique for fabricating an SBD integrated AC LED may involve growing the LED epi-layers and SBD epi-layers separately on different regions of the substrate and buffer layer by a two-step growing and etching processes.

These and other prior art fabrication techniques make modifications to the epi-layer growth of the LED wafer by epitaxy, deposition, ion implantation, diffusion, or by a two-step growth. These may lead to a significant increase in the cost of fabricating the SBD integrated AC LED.

Figure 2:
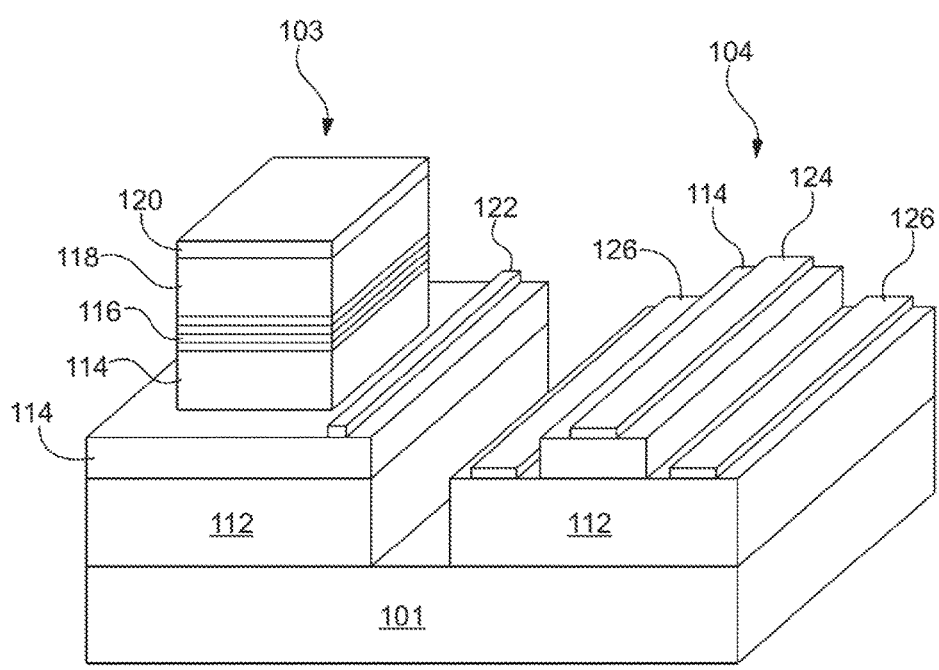
FIG. 2 is a perspective view of an embodiment of an AC LED and an embodiment of a SBD on a wafer that may be used to generate an embodiment of an integrated circuit, according to some embodiments.

The inventors have recognized and appreciated that there is a need for a technique of fabricating an LED and SBD, such that the LED and SBD are monolithically integrated on a wafer (e.g., a commercially available LED wafer, such a GaN LED wafer for example), and such that the SBD has high breakdown voltage and low forward biased voltage drop Discussion of Some Embodiments Referring to FIGS. 1-2, an LED-SBD 100 may be configured as an AC LED by structuring the LED-SBD 100 as a rectifier circuit coupled to an AC power supply. In some embodiments, this may be achieved by structuring the LED-SBD 100 as a Wheatstone bridge (WB) circuit 106. For example, arms 108, 110 of a Wheatstone bridge (WB) circuit 106 may include one or more SBDs 104. The one or more SBDs 104 in the arm 108, 110 of a WB circuit 106 may be configured to withstand the maximum reverse-bias voltage applied to the arm 108, 110 of the WB circuit 106 by the system's AC voltage source. While increasing the number of SBDs 104 in an arm 108, 110 of the WB circuit 106 may increase the reverse-bias breakdown voltage of the set of SBDs 104, decreasing the number of SBDs 104 in an arm 108, 110 of the WB circuit 106 may improve the efficiency of a light source 102 light source comprising the WB circuit 106. The light source 102 can be an LED, for example. When one or more LED light sources 102 are in connection to the LED-SBD 100, the LED light source 102 can be an AC LED light source 102.

In some embodiments, an SBD 104 may be configured to exhibit a reverse-bias breakdown voltage greater than the peak voltage of the light source's AC supply, such that a single SBD 104 in an arm 108, 110 of the WB circuit 106 can be sufficient to withstand the maximum reverse-bias voltage applied to the WB's arm 108, 110. In some embodiments, an SBD 104 may be configured to exhibit a reverse-bias breakdown voltage greater than half the peak voltage of the light source's AC supply, such that two series connected SBDs 104 in an arm 108, 110 of the WB circuit 106 can be sufficient to withstand the maximum reverse-bias voltage applied to the WB's arm 108, 110.

The breakdown voltage ($V_r$) of the SBD 104 may be defined as the reverse biased working voltage of the SBD 104 when the reverse leakage current reaches 0.1 mA. Since the peak voltage of a 110 V AC power supply is 110 V×√2=156 V, in embodiments where there is one SBD 104 on each arm 108, 110 of a WB circuit 106, the reverse biased working voltage $V_r$ of the SBD may be higher than $V_{r1}$=156 V. In embodiments where there are two SBDs 104 on each arm 108, 110 of the WB circuit 106 and the power supply is a 110 V AC supply, the $V_r$ of the SBD 104 may be higher than $V_{r2}$=156 V/2=78 V. As previously mentioned, using conventional etching technique, the SBD 104 fabricated on a LED wafer may have a $V_r$ as low as approximately 15 V to 25 V. Yet, with embodiments of the fabrication techniques described herein, SBDs 104 can be generated with reverse biased working voltages $V_r$ of at least $V_{r2}$=78 V, or at least $V_{r1}$=156 V.

In some embodiments, an LED and an SBD 104 can be fabricated on a substrate 101. The substrate 101 may be part of a wafer 103. The wafer 103 may be an LED wafer 103. In some embodiment, the wafer 103 can be a commercially available GaN LED wafer 103. For example, an embodiment of the fabrication method disclosed herein may use an LED wafer 103 to etch at least one SBD 104 within a portion of the LED wafer 103. This may be done to form an embodiment of the integrated LED-SBD 100. With some embodiments of the disclosed fabrication method, no special treatment or modifications during the LED wafer 103 growth is required. As will be explained in greater detail, embodiments of the fabrication method, can include forming a Schottky contact 126 a buffer layer 112 of the etched portion of the LED wafer 103 and forming an Ohmic contact 124 on an n-type layer 114 of the etched portion of the LED wafer 103 to facilitate generating the SBD 104. To achieve the objective of an integrated LED-SBD 100, where the SBD 104 has high breakdown voltage, a mixed etching fabrication technique may also be used to expose at least a portion of the buffer layer 112.

FIG. 1 shows an exemplary schematic diagram for an integrated LED-SBD 100. The integrated LED-SBD 100 may be used as part of an integrated circuit. Embodiments of the integrated LED-SBD 100 can include one or more AC LED light sources 102 with one or more SBDs 104. The AC LED light sources 102 and/or the SBDs 104 can be configured to form a WB circuit 106. For example the WB circuit 106 can include a first arm 108 and a second arm 110. The first arm 108 may include a first bottom arm 108a and a first upper arm 108b. The second arm 110 may include a second bottom arm 110a and a second upper arm 110b. The first bottom arm 108a may connect with the first upper arm 108b. The first upper arm 108b may connect with the second upper arm 110b. The second upper arm 110b may connect with the second bottom arm 110a. The second bottom arm 110a may connect with the first bottom arm 108a. A voltage source may be connected to a junction of the first bottom arm 108a and the first upper arm 108b. The voltage source may also be connected to a junction of the second bottom arm 110a and the second upper arm 110b. The voltage source may be an AC voltage source. A load may be connected to a junction of the first upper arm 108b and the second upper arm 110b. The load may also be connected to a junction of the first bottom arm 108a and the second bottom arm 110a. The load may be at least one AC LED light source 102.

At least one SBD 104 can be included on the first arm 108. At least one SBD 104 can be included on the second arm 110. Some embodiments can include two or more SBDs 104 on one or more arms 108, 110 of the WB circuit 106. For example, some embodiments can include a first SBD 104 and a second SBD 104, arranged in series on the first arm 108. This may include the first SBD 104 on the first bottom arm 108a and the second SBD 104 on the first upper arm 108b. Some embodiments can further include a third SBD 104 and a fourth SBD 104, arranged in series on the second arm 110. This may include the third SBD 104 on the second bottom arm 110a and the third SBD 104 on the second upper arm 110b. More or less SBDs 104 and other configurations can be used.

The integrated circuit 100 can be configured such that when a voltage (e.g. an AC voltage) from the voltage source is applied from left to right side of the WB circuit 106 (or from the first arm 108 side to the second arm side 110), the current may flow through the first upper arm 108b of the WB circuit 106, the load (e.g., one or more AC LEDs 102), and then through the second bottom arm 110a of WB circuit 106. At least one of the SBD 104 on the second upper arm 110b and the SBD 104 on the first bottom arm 108a may undergo a reverse biased voltage. When the voltage is applied from right to left side of the WB circuit 106 (or from the second arm 110 side to the first arm side 108), the current may flow through the second upper arm 110b of the WB circuit 106, the load (e.g., one or more LEDs 102), and then through the first bottom arm 108a of the WB circuit 106. At least one of the SBD 104 on the first upper arm 108b and the SBD 104 on the second bottom arm 110a may undergo a reverse biased voltage. This may facilitate causing the one or more AC LEDs 102 in the integrated LED-SBD 100 to emit light, regardless of the direction the voltage is applied.

FIG. 2 shows a schematic diagram of an embodiment of a LED and an embodiment of a SBD 104 integrated on a single substrate 101 that may be used to form an embodiment of an integrated LED-SBD 100. The substrate 101 may be configured as a substrate 101 for a LED wafer 103. For example, some embodiments of the integrated LED-SBD 100 can include an LED formed on at least a portion of the substrate 101 to form the LED wafer 103. The SBD 104 can be formed by etching at least a portion of the LED wafer 103. This may be done to facilitate generating an embodiment of the integrated LED-SBD 100.

Some embodiments can include a substrate layer 101 upon which an LED wafer 103 and a SBD 104 is formed. The substrate layer 101 may be a sapphire substrate 101, for example. However, other substrate materials can be used. During the etching process, SBD 104 may be formed so that the SBD 104 can be adjacent the LED wafer 103 structure.

LED wafer 103 can include a buffer layer 112 disposed on a surface of the substrate layer 101. The buffer layer 112 can be an un-doped semiconductor material. The buffer layer 112 may be an un-doped GaN layer. However, other semiconductor materials can be used. The LED wafer 103 can further include an n-type layer 114 disposed on a surface of the buffer layer 112. The n-type layer 114 may be an n-type GaN layer. However, other semiconductor materials can be used. The LED wafer 103 can further include an active layer 116 disposed on a surface of the n-type layer 114. The active layer 116 may be configured as a MQW layer. The MQW active layer 116 may be an InGaN/GaN MQW active layer 116. However, other semiconductor materials can be used. The LED wafer 103 can further include a p-type layer 118 disposed on a surface of the active layer 116. The p-type layer 118 may be a p-type GaN layer 118. However, other semiconductor materials can be used. In some embodiments, the LED wafer 103 can be configured to include a top emission structure. The top emission structure may include an anode material 120 and/or a cathode material 122. The anode material 120 may be disposed on a surface of the p-type layer 118. The cathode material 122 may be disposed on a surface of the n-type layer 114. The anode material 120 can be any suitable anode material, such as indium tin oxide (ITO) for example. The cathode material 122 can be any suitable cathode material, such as titanium/aluminum/titanium/gold (Ti/Al/Ti/Au), chromium/platinum/gold (Cr/Pt/Au), for example.

The SBD 104 can include a mesa structure that is formed on the same substrate 101 as the LED wafer 103. The SBD 104 can be separate by the LED by a distance. The SBD 104 can be formed on a same surface of the substrate 101 that the LED is formed on. The SBD 104 can include the buffer layer 112 disposed on a surface of the substrate layer 101. The buffer layer 112 may be configured the same as or different from the buffer layer 112 of the LED wafer 103. The SBD 104 can further include an n-type layer 114 disposed on a surface of the buffer layer 112. The n-type layer 114 may be configured the same as or different from the n-type layer 114 of the LED wafer 103. An Ohmic contact material 124 may be disposed on a surface of the n-type layer 114. The Ohmic contact material 124 can be a metal. This can include Ti/Al/Ti/Au, Cr/Pt/Au, and/or any other suitable material. A Schottky contact material 126 may be disposed on a surface of the buffer layer 112. The Schottky contact material 126 can be a metal. This can include nickel/gold, platinum/gold (Ni/Au, Pt/Au), and/or any other suitable material.

Some embodiments can include more than one LED on the substrate 112. Some embodiments can include more than one SBD 104 on the substrate 112. The number of LEDs formed on the substrate 101 can be the same as or different from the number of SBDs 104 on the substrate 101.

FIGS. 3A-3H illustrate an embodiment of a method for fabricating an embodiment of a SBD 104 on a substrate 101. This can include fabricating an SBD 104 on a substrate 101 of a LED wafer 103. In some embodiments, the method illustrate by FIGS. 3A-3H can be used to generate an embodiment of the integrated LED-SBD 100.

Figure 3A:
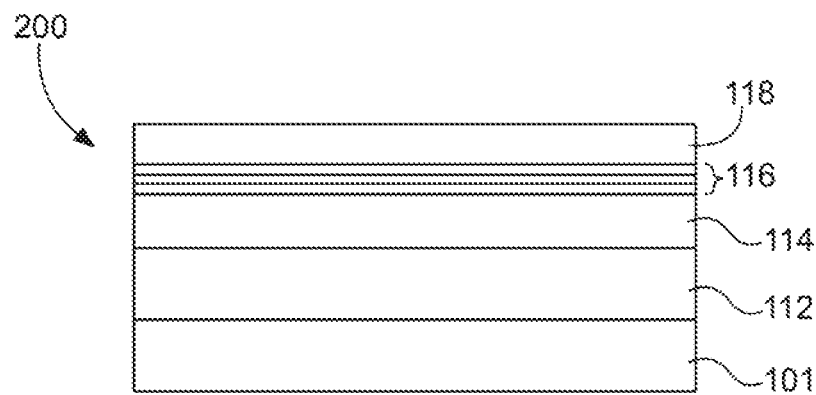
FIGS. 3A-3H show an embodiment of a method that may be used for fabricating an embodiment of a SBD on an embodiment of a LED wafer, according to some embodiments, and also illustrate an embodiment of a LED wafer at various stages of the method for fabricating the SBD on the LED wafer, with FIG. 3A illustrating the layers of a commercially available LED wafer, FIG. 3B illustrating the LED wafer after etching (e.g., dry etching), FIG. 3C illustrating the LED wafer after a first cycle of mixed etching, FIG. 3D illustrating the LED wafer after a second cycle of mixed etching, FIG. 3E illustrating the LED wafer after a third cycle of mixed etching, FIG. 3F illustrating the LED wafer after annealing and passivation, FIG. 3G illustrating the LED wafer after Ohmic metal deposition, and FIG. 3H illustrating the LED wafer after Schottky metal deposition, according to some embodiments.

FIG. 3A shows an exemplary step 200 that may be used with an embodiment of the fabrication method. This can include forming an LED wafer 103. The LED wafer 103 can include the buffer layer 112 disposed on a surface of the substrate layer 101. The LED wafer 103 can further include an n-type layer 114 disposed on a surface of the buffer layer 112. The LED wafer 103 can further include an active layer 116 disposed on a surface of the n-type layer 114. The LED wafer 103 can further include a p-type layer 118 disposed on a surface of the active layer 116.

Figure 3B:
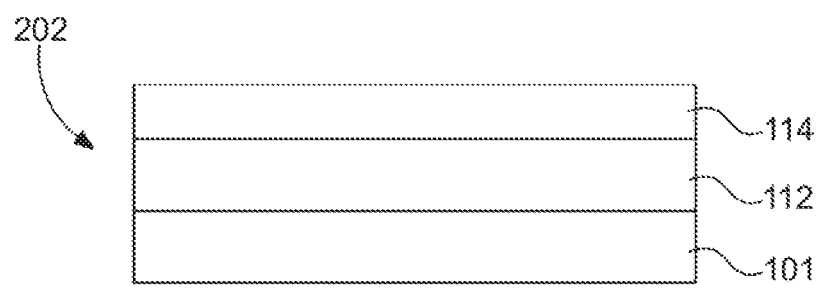

FIG. 3B shows an exemplary step 202 that may be used with an embodiment of the fabrication method. Step 202 can include etching at least a portion of the LED wafer 103 so as to form an SBD 104 on at least a portion of the substrate 101 of the LED wafer 103. The etching may be performed on a portion of the LED wafer 103 that is intended for formation of the SBD 104 on the substrate 101 of the LED wafer 103. This can include etching at least a portion of at least one of the p-type layer 118 and the active layer 116. This can include etching a portion of the p-type layer 118 and/or the active layer 116 down to the n-type layer 114, as shown in FIG. 3B. This may further include etching until at least a portion of the n-type layer 114 is exposed. The etching can include used of a dry etching techniques. In some embodiments, the dry etching process may include an inductively coupled plasma (ICP) reactive-ion etching (RIE) system and/o Chlorine based plasma. However, other etching techniques can be used.

Figure 3C:
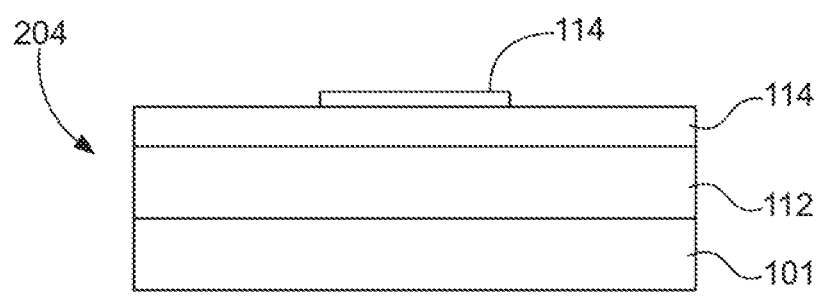
Figure 3D:
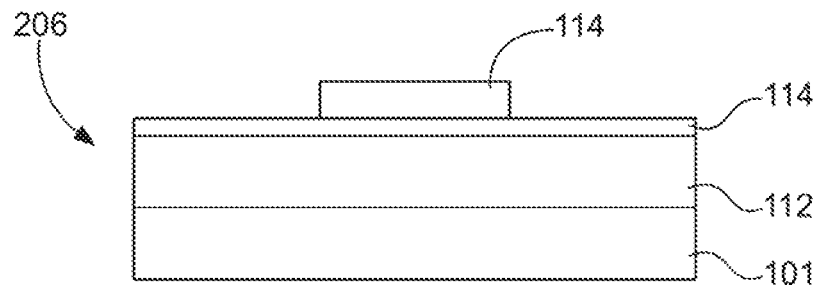
Figure 3E:
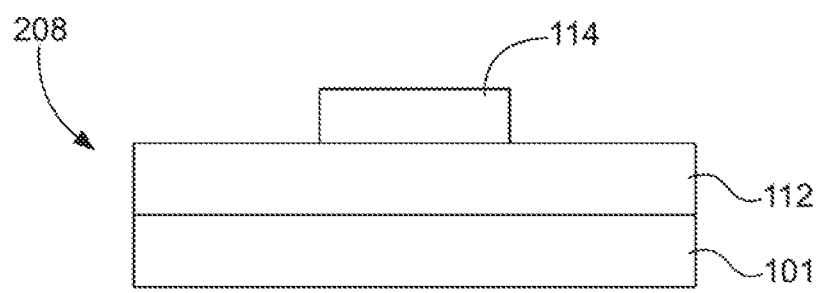

FIGS. 3C, 3D, and 3E show exemplary steps 204, 206, and 208 that may be used with an embodiment of the method. These can include one or more cycles of a mixed etching method that may be applied to the portion of the LED wafer 103 that has undergone etching in step 202. In an exemplary embodiment, the mixed etching method can include three etching cycles. FIG. 3C illustrates step 204 as a first etching cycle, FIG. 3D illustrates step 206 as a second etching cycle, and FIG. 3E illustrates step 208 as a third etching cycle. The first step may include a cyclic dry etching procedure. This may include a cyclic dry etching procedure. The second step may include an etch-removal process of defects. This may include a photochemical etch-removal process of plasma induced defects. The third step may include a passivation process. This may include a sulfide-mediated surface passivation process. While three exemplary mixed etching cycles are disclosed, the mixed etching method can include any number of etching cycles. Any of the cycles can use an etching method that is the same as or different from another etching cycle. In some embodiments, the mixed etching method may be repeated. The mixed etching method may be performed until a portion of buffer layer 112 is exposed. The mixed etching method may be performed until a portion of the buffer layer 112 that may be intended for disposition of the Schottky contact material 126 is exposed.

Figure 3F:
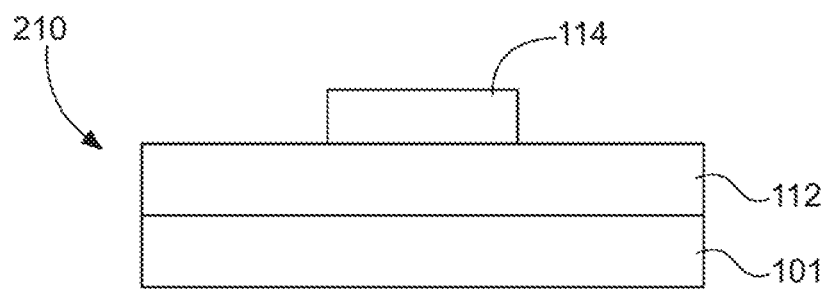

FIG. 3F shows an exemplary step 210 that may be used with an embodiment of the fabrication method. Step 210 can include at least one of annealing and/or passivating at least a portion of the LED wafer 103. In some embodiments, at least a portion of the LED wafer 103 may be annealed at approximately 850° C. This may include annealing for approximately 2 minutes. This may include annealing in an atmosphere of Nitrogen ($N_2$). This may include use of a rapid thermal annealing (RTA) system. The annealing process may facilitate recovery from etching damage. For example, annealing may facilitate recovery from damage that an etching technique may cause to at least one of the layer. Some embodiments can further include passivation of at least a portion of the LED wafer 103. In some embodiments, the passivation process may be sulfide-mediated. In some embodiments, passivating at least a portion of the LED wafer 103 may include soaking at least a portion of the LED wafer 103 in $(NH_4)_2S$:Isopropanol (IPA) 1:10. This can include soaking for approximately 1 minute. Passivation may include passivating at least one surface of the LED wafer 103 with a thin layer of $(NH_4)_2S$ (not shown). Annealing and/or passivating may be performed on any portion of the LED wafer 103. This can include annealing and/or passivating on a portion intended for SBD 104 formation. FIG. 3F illustrates an embodiment of an LED wafer 103 after the passivation and annealing of step 210 is performed.

Figure 3G:
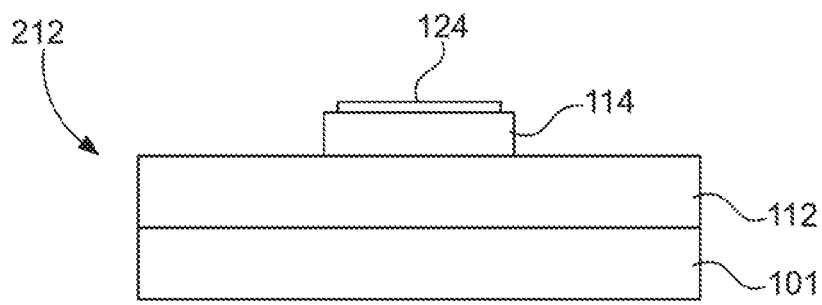

FIG. 3G shows an exemplary step 212 that may be used with an embodiment of the fabrication method. Step 212 can include depositing an Ohmic contact material 124 on at least a portion of the exposed surface of the n-type layer 114. In some embodiments, the Ohmic contact material 124 may include a first layer of Ti (e.g., with a thickness of 10 nm), a layer of Al (e.g., with a thickness of 40 nm), a second layer of Ti (e.g., with a thickness of 40 nm), and a layer of Au (e.g., with a thickness of 200 nm). After deposition of the Ohmic contact material 124, at least a portion of the LED wafer 103 may be annealed. In some embodiments, at least a portion of the LED wafer 103 may be annealed at 500° C. This can include annealing for approximately 1 minute. This can include annealing in an atmosphere of $N_2$. This can further include annealing in a RTA system. FIG. 3G illustrates an embodiment of the LED wafer 103 after the Ohmic material 124 deposition of step 212 is performed.

Figure 3H:
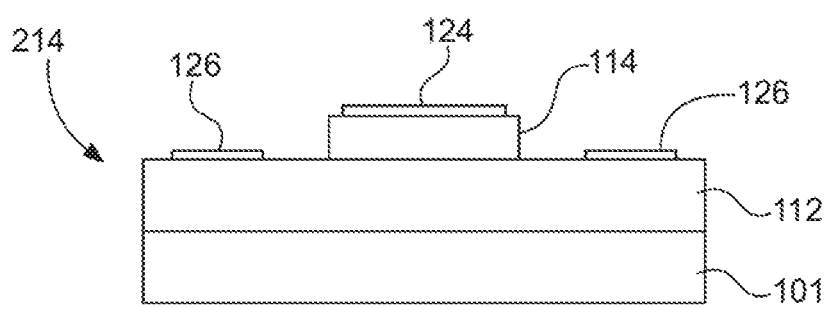

FIG. 3H shows an exemplary step 214 that may be used with an embodiment of the fabrication method. Step 214 can include depositing a Schottky contact material 126 on at least a portion of the exposed surface of the buffer layer 112. In some embodiments, the Schottky contact material 126 may include a layer of Ni (e.g., with a thickness of 40 nm) and a layer of Au (e.g., with a thickness of 200 nm). FIG. 3H illustrates an embodiment of the LED wafer 103 after the Schottky material 126 deposition of step 214 is performed.

Figure 4A:
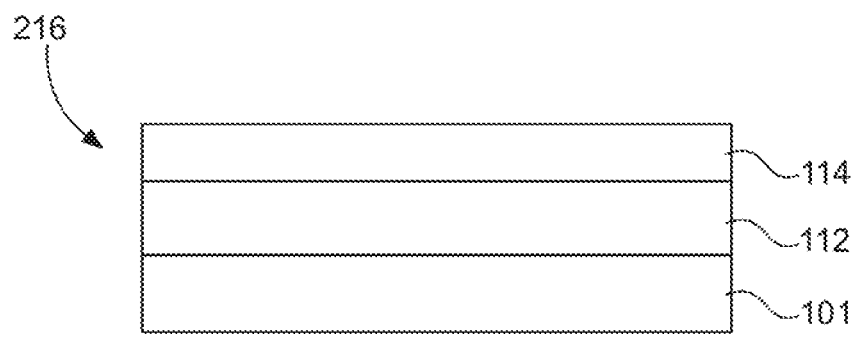
FIGS. 4A-4D show a mixed etching method, according to some embodiments, and also illustrate an LED wafer at various stages of the mixed etching method, with FIG. 4A illustrating the LED wafer at the beginning of the mixed etching process, FIG. 4B illustrating the LED wafer after oxidation, FIG. 4C illustrating the LED wafer after etching, and FIG. 4D illustrating the LED wafer after surface treatment, according to some embodiments.

FIGS. 4A-4D show another mixed etching method that may be used with an embodiment of the fabrication method. In some embodiments, the mixed etching method may be applied to the LED wafer 103 after the p-type layer 118 and/or the active layer 116 have been removed. The p-type layer 118 and/or the active layer 116 can be removed by conventional dry etching techniques. FIG. 4A shows an exemplary step 216 that may be used with an embodiment of the method. Step 216 can include removal of the p-type layer 118 and/or the active layer 116 by conventional dry etching. FIG. 4A illustrates an embodiment of an LED wafer 103 after the p-type layer 118 and the active layer 116 have been removed.

Figure 4B:
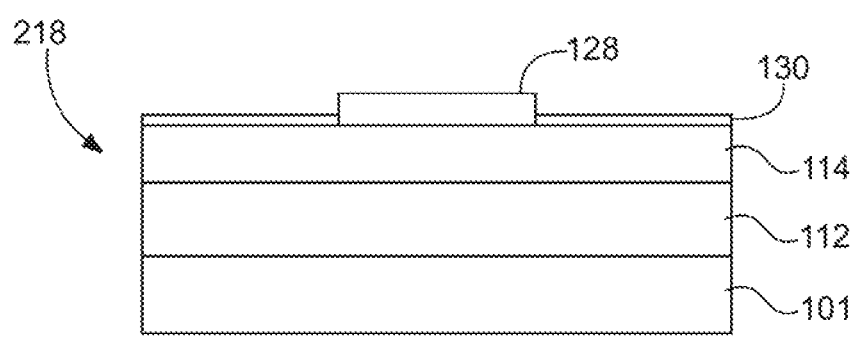

FIG. 4B shows an exemplary step 218 that may be used with an embodiment of the fabrication method. Step 218 can include depositing a protective layer 128 on at least a portion of the LED wafer 103. The protective layer 128 may include silicone dioxide ($SiO_2$). Some embodiments can further include depositing an oxide layer 130 on at least a portion of the LED wafer 103. For example, an oxide layer 130 can be disposed on a portion of the LED wafer 103 that is not covered by the protective layer 128. The oxide layer 130 can be a thin layer (e.g., a layer with an average thickness of less than approximately 10 nm, between approximately 2 nm and 10 nm, or less than approximately 2 nm). The oxide layer 130 may be $Ga_2O_3$. For example, $Ga_2O_3$ may be grown on at least some portions of the LED wafer 103 surface not covered by the protective layer 128. This may be achieved by oxidizing a surface of the LED wafer 103. This may include dry oxidizing. Step 218 can include providing a protective layer 128 and/or an oxide layer 130 on any portion of the LED wafer 103. This may include providing a protective layer 128 and/or an oxide layer 130 on any portion of the LED wafer 103 that is intended to have the SBD 104 formed thereon. Some embodiments can include oxidizing at least at portion of the LED wafer 103 surface corresponding to an area that is intended for formation of the Schottky contacts 126, while at least some of the other areas of the LED wafer 103 surface may protected by the protective layer 128. In some embodiments, oxidizing the Schottky contact 126 areas can include oxidizing the Schottky contact 126 areas at 800° C. This may include oxidizing in an atmosphere of dry oxygen. FIG. 4B illustrates an embodiment of the LED wafer 103 after deposition of a protective layer 128 and growth of a thin oxide layer 130.

Figure 4C:
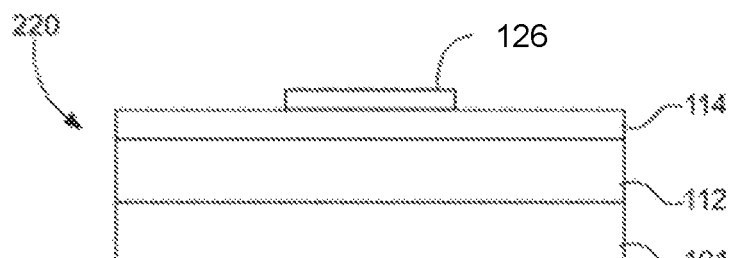

FIG. 4C shows an exemplary step 220 that may be used with an embodiment of the fabrication method. Step 220 can include etching the Schottky contact 126 areas. This may include dry etched, dry etching with ICP RIE, etc. This may include dry etching the Schottky contact 126 areas while at least some of the other areas of the LED wafer 103 can be protected by an etch mask. The etch mask can be a Ni etch mask, for example. It should be noted that the oxide layer 130 grown during step 218 may be used to decrease at least some defects introduced by the dry etching process. This can include decreasing at least some defects introduced by the dry etching process performed in step 220. FIG. 4C illustrates an embodiment of the LED wafer 103 after the etching of step 220 is performed.

Figure 4D:
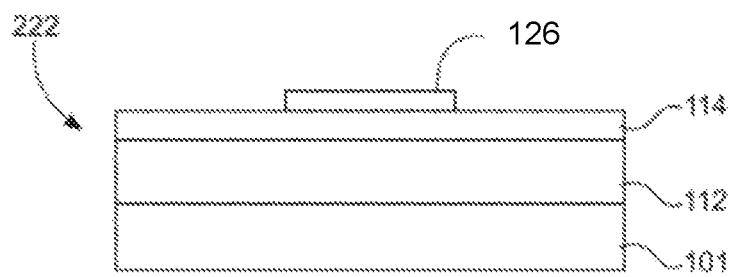

FIG. 4D shows an exemplary step 222 that may be used with an embodiment of the fabrication method. Step 222 can include treating at least a portion of the LED wafer 103. This may include treating a portion of the surface of the LED wafer 103. This can include treating an etched portion of the LED wafer 103. The treatment can include a photo-chemical treatment. For example, at least a portion of an etched surface may be photo-chemically treated. The photo-chemical treatment can include exposure to a potassium hydroxide (KOH) solution under ultraviolet (UV) illumination. In some embodiments, the UV illumination may facilitate photo-enhanced chemical (PEC) wet etching. In some embodiments, at least a portion of the surface of the Schottky contact 126 area may be exposed to a 0.02 M KOH solution. This may include being exposed to a 150 mW/cm$^2$, 254 nm wavelength UV illumination. This may include treating at least a portion of the surface of the Schottky contact 126 area for approximately 10 minutes. In some embodiments, at least one of the other areas of the LED wafer 103 can be protected by a mask. This may include a Ni mask. Embodiments of the treatment may be effective in removing at least some defects in at least some layers of the LED wafer 103. For example, embodiments of the treatment can remove at least some defects in at least some layers of the LED wafer 103 introduced during the etching at step 220. FIG. 4D illustrates an embodiment of the LED wafer 103 after the surface treatment of step 222 is performed.

The fabrication methods of FIGS. 3A-3H and 4A-4C may be used to fabricate one or more SBDs 104 on a substrate 101 of a LED wafer 103. In some embodiments, an SBD 104 fabricated using embodiments of the method may have a reverse-biased working voltage $V_r$ of at least 78 V or at least 156 V. SBDs 104 with reverse-biased working voltages as high as 160 V can be fabricated using embodiments of the method. Thus, embodiments of the SBDs 104 disclosed herein may be referred to as high-breakdown SBDs 104. In some embodiments, multiple SBDs 104 may be fabricated using embodiments of the method. This can include coupling the multiple SBDs 104 together to form a WB circuit 106. This may be done to form an integrated LED-SBD 100. The integrated LED-SBD 100 can be configured form an AC-LED light source 102. For example, multiple SBDs 104 can be used to form the WB circuit 106. One or more LEDs may be fabricated on the same LED wafer 103 as the SBDs 104 and coupled to the WB circuit 106, as shown in FIG. 1.

Empirical Results

High-breakdown SBDs 104 can be fabricated on an LED wafer 103 using an embodiment of the fabrication methods disclosed herein. For comparison, conventional SBDs can also be fabricated using a conventional etching technique.

For example, to generate a high-breakdown SBD 104, an LED wafer 103 may be etched through the p-type GaN layer 118 and through the MQW active layer 116 to the n-type GaN layer 114 with an ICP etch system. The LED wafer 103 may then be etched to the un-doped GaN buffer layer 112 to expose the Schottky contact area 126. Next, the LED wafer 103 may be annealed at 850° C. for 2 minutes in a $N_2$ atmosphere with a RTA system. Later, the LED wafer 103 can be passivated with a thin layer of $(NH_4)S$. The Ohmic contact material 124 may be deposited on the n-type GaN layer 114. At least a portion of the LED wafer 103 can be annealed at 500° C. for 1 minute in a $N_2$ atmosphere with a RTA system. The Schottky contact material 126 can then be deposited on the un-doped GaN buffer layer 112.

Figure 5A:
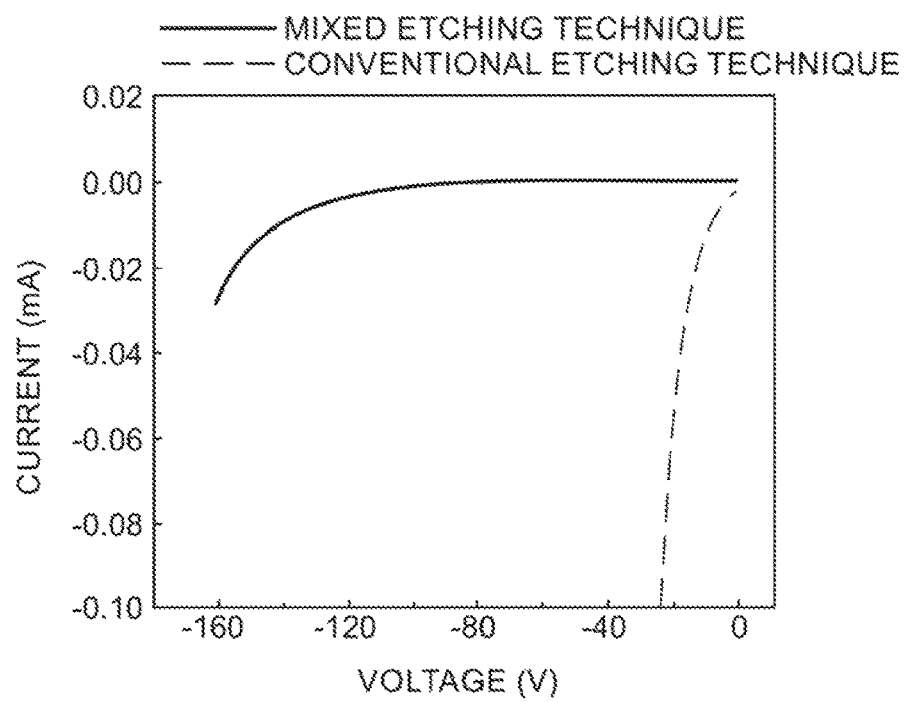
FIG. 5A is a graph of reverse biased current-voltage (IV) curves of an SBD fabricated with a conventional etching technique and an embodiment of an SBD fabricated with an embodiment of the disclosed mixed etching technique.
Figure 5B:
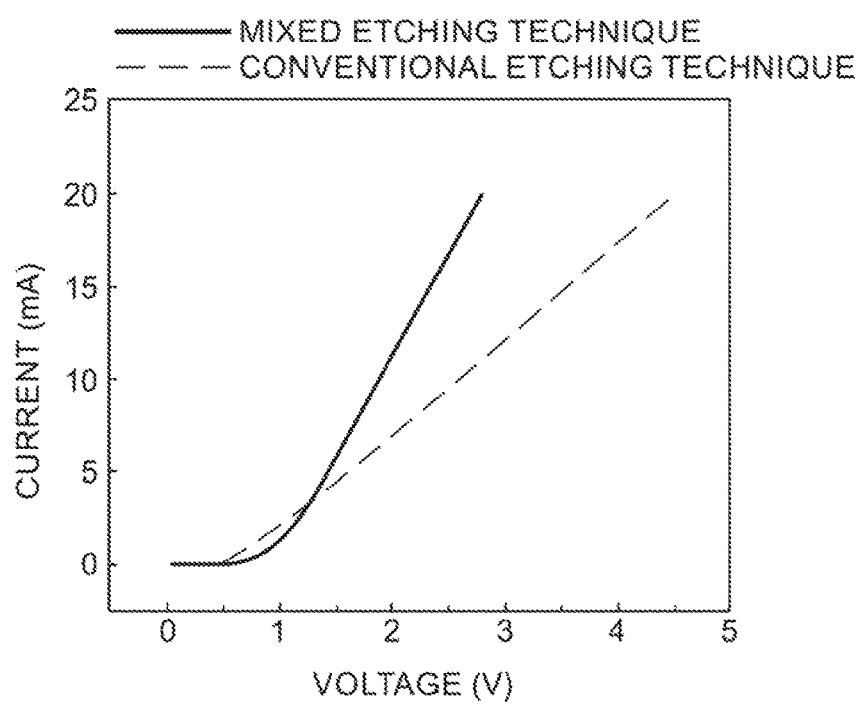
FIG. 5B is a graph of forward biased current-voltage (IV) curves of an SBD fabricated with a conventional etching technique and an embodiment of an SBD fabricated with an embodiment of the disclosed mixed etching technique.

After the high-breakdown SBDs 104 and conventional SBDs are fabricated, the current-voltage (IV) curves may be characterized by a Keithley 2612 semiconductor parameter analyzer, as shown in FIGS. 5A-5B. With the conventional etching technique, the reverse-biased working voltage $V_r$ of the SBD may be measured to be 26.7 V. With the mixed etching technique, the $V_r$ of the SBD 104 may be measured to be higher than 160 V. As previously mentioned, the peak voltage of 110 V AC power supply is $V_{r1}=156$ V. Consequently, with conventional etching technique, the number of SBDs on each arm of the WB circuit may have to be at least 156 V/26.7 V=6 conventional SBDs. With SBDs 104 formed by embodiments of the method disclosed herein, this number could be reduced to 156 V/160 V=1 high-breakdown SBD 104. The significant decrease of the number of SBDs 104 can be important in at least two respects. First, during operation of the AC LED light source, a part of the voltage is also applied to the forward-biased SBDs. Fewer SBDs can lead to less power lost on the forward-biased SBDs. This can facilitate generating an AC LED light source with higher power efficiency, which may be important for some practical applications of AC LEDs. Second, fewer SBDs can result in a smaller chip area of SBDs. This can facilitate increasing the area usage efficiency of the AC LED.

To estimate the power efficiency, the forward-working voltage $V_f$ (e.g., the forward-biased voltage of the SBD 104 where the forward current reaches 20 mA) can be measured. From the results shown in FIG. 5B, the $V_f$ of the conventional SBD may be measured to be 4.50 V. If the conventional SBD is employed for AC LED fabrication, the voltage drop across the six forward biased SBDs in each of two arms of the WB circuit may be 2×6×4.50V=54V. As a result, 54V/110V=49% of the power may be dissipated by the conventional SBDs. Employing embodiments of the method disclosed herein, the $V_f$ of the high-breakdown SBD 104 may be measured to be 2.81 V. The voltage drop across the single forward-biased SBD 104 in each of the two arms 108, 110 of the WB circuit 106 may be 2×1×2.81V=5.62V. As a result, the power dissipated by the high-breakdown SBDs 104 may be reduced to 5.62V/110V=5.1%.

Figure 6A:
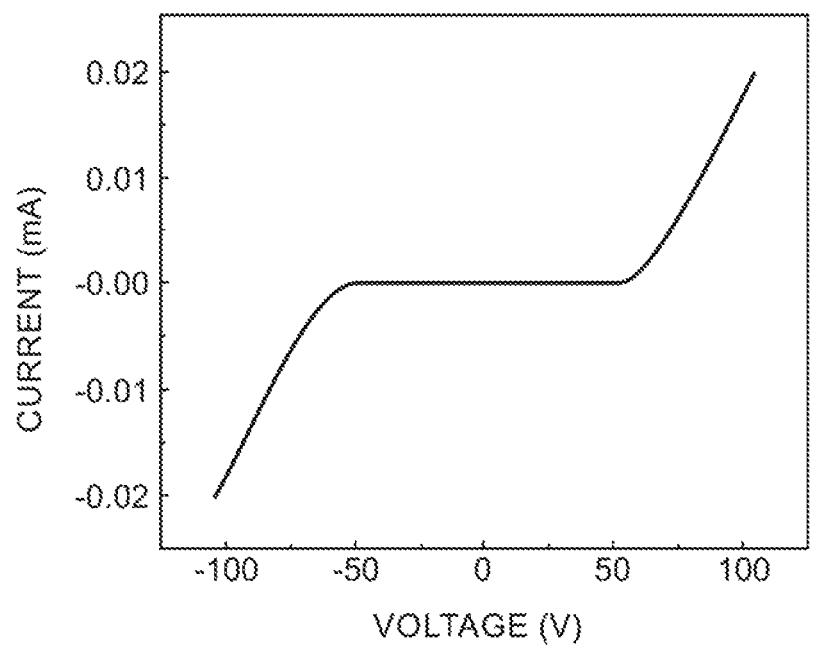
FIG. 6A is a graph of a current-voltage (IV) curve of an embodiment of an integrated LED-SBD configured as an AC LED, according to some embodiments.

An AC LED light source 102 can be generated by fabricating multiple high-breakdown SBDs 104 on an LED wafer 103 using an embodiment of the methods disclosed herein. This may be achieved by fabricating LEDs on the LED wafer 103, and coupling the high-breakdown SBDs 104 and LEDs together to form an AC LED circuit. For example, interconnection metal can be used to couple the SBDs 104 and LEDs to form an AC LED circuit of FIG. 1. For instance, an embodiment of an AC LED light source 102 can include twenty-six series-connected LEDs, and one high-breakdown SBD 104 on each arm 108, 110 of the WB circuit 102. The IV curve of an embodiment of an AC LED light source 102 is shown in FIG. 6A. The AC LED light source 102 may be turned on when the voltage is applied to in both directions. The turn on voltage of the AC LED light source 102 (e.g., the voltage of the AC source at which the current through the LEDs reaches 0.1 mA) and working voltage of the AC LED light source 102 (e.g., the voltage of the AC source at which the current through the LEDs reaches 20 mA) may be measured to be 54V and 105V, respectively, for both directions of the AC source.

Figure 6B:
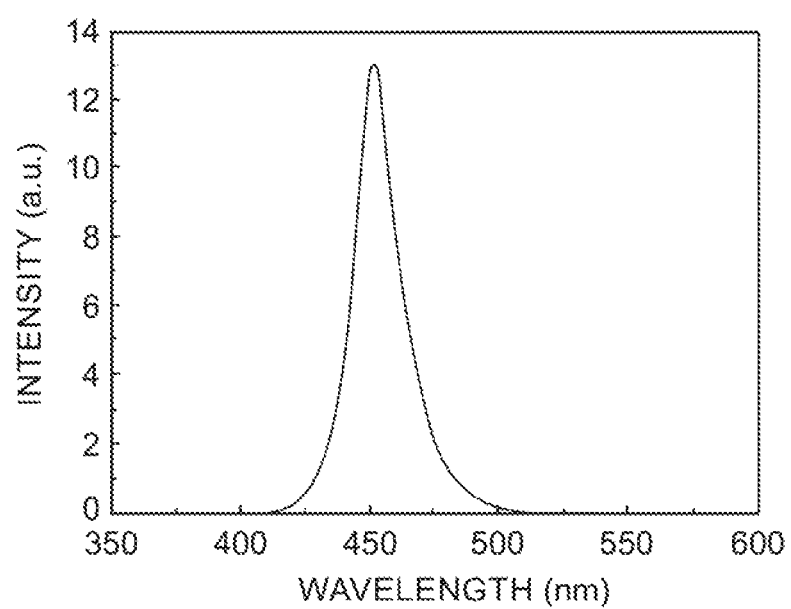
FIG. 6B is a graph of an electroluminescence (EL) spectrum of an embodiment of an integrated LED-SBD configured as an AC LED, according to some embodiments.

To measure the output spectrum and external power efficiency of an embodiment of the AC LED light source 102, the AC LED light source 106 may be placed inside an integrating sphere. The output emission of the AC LED light source 102 may be diffusely reflected by a barium sulfate-coated inner surface of the sphere so as to be redistributed isotropically into all solid angles. The spectral and intensity detection of the light exiting from a small aperture at the sphere surface may be used as an accurate determination of the total number of photons from the AC LED light source 102. The output of the integrating sphere can be collected and characterized by a measurement system (e.g., Hopoo 2000™). FIG. 6B shows the electroluminescence (EL) spectrum of an embodiment of an AC LED light source 102 that included high-breakdown SBDs 104. It can be seen that the peak wavelength locates at 451.5 nm. The full width at half maximum (FWHM) bandwidth is 20 nm. The output power may be 324.1 mW. With the input electrical power fixed at 1 W, the external power efficiency of the AC LED light source 102 may be 32.4%. For comparison, a high voltage (HV) LED may also be fabricated similar to the AC LED 102, but without any high-breakdown SBDs 104. The external power efficiency of the HV LED may be measured to be 35.2%. With the exemplary configuration, it can be seen that the external power efficiency of AC LED 102 can be 2.8% less than HV LED. This may imply that less than 8% of power loss may be introduced by the integrated SBDs 104 in the WB circuit 106.

The circuit configurations and performance characterizations described in this section are offered as examples associated with some embodiments of the techniques disclosed herein, and are not limiting.

An Embodiment

Integration of LEDs (e.g., III-nitride LEDs) and SBDs may be beneficial for various applications. These can include, but are not limited to electrostatic discharge (ESD) protection, AC LEDs with on-chip bridge rectifiers, etc. Yet, conventional dry etching techniques may induce nitrogen vacancies in the GaN lattice. This may lead to a high surface concentration of defect donors. This may further lead to poor SBD performance (e.g., high saturation current and very low breakdown voltage).

Embodiments of methods of fabrication disclosed herein can be used for monolithic integration of efficient LEDs and SBDs over patterned substrates 101. For example, a patterned sapphire substrate 101 can be used for monolithic integration of efficient III-nitride-LEDs and high-breakdown SBDs 104. Some embodiments of the monolithic integration can include at least one processing step. At least one embodiment can include a three-step processing technique. The first step may include a cyclic dry etching procedure. This may include a cyclic GaN dry etching procedure. The second step may include an etch-removal process of defects. This may include a photochemical etch-removal process of plasma induced GaN defects. The third step may include a passivation process. This may include a sulfide-mediated surface passivation process.

In one embodiment, a monolithic integrated LED-SBD 100 can be fabricated from a LED epiwafer 103. This may include a 2-inch commercial LED epiwafer 103. The LED epiwafer 103 may include a patterned substrate 101. The patterned substrate 101 may be a sapphire substrate 101. A buffer layer 112 may be formed on a surface of substrate layer 101. The buffer layer 106 may be unintentionally doped. In some embodiments, the buffer layer 106 may be an unintentionally doped GaN buffer layer. An n-type layer 114 may be formed on a surface of the buffer layer 112. The n-type layer 114 may be an n-type GaN layer. A MQW emissive layer 116 may be formed on a surface of the n-type layer 114. A p-type layer 118 may be formed on a surface of the MQW emissive layer 116. The p-type layer 118 may be a p-type GaN layer. In some embodiments, the LED portion of the LED epiwafer 103 can have a mesa dimension of 300 μm×300 μm. The LED portion may be configured with an ITO current spreading layer on the p-type layer 118. The LED portion may further include a Cr/Pt/Au metal layer for both of a p-type and/or an n-type Ohmic contact 124. The SBD 104 portion can include a Schottky material 126 deposited on a surface the buffer layer 112. This can include a Ni/Au Schottky material 126. This can include a Schottky material 126 formed in a recess-etched region of the buffer layer 112. The Ohmic contact 124 may be formed on n-type GaN layer 118. The performance of the integrated LED-SBD 100 is plotted in FIGS. 7A and 7B, which show that the monolithic integrated LED-SBD 100 can exhibit a forward working voltage of 3.67V at 40 mA and a peak external quantum efficiency of 53%.

Figure 8A:
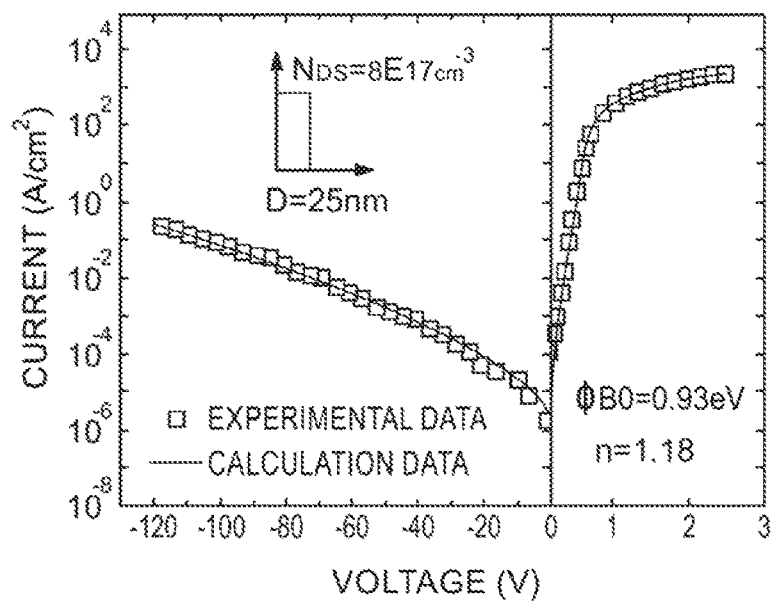
FIG. 8A is a graph of the current-voltage (I-V) characteristic of an embodiment of a nickel (Ni)/un-doped GaN SBD, according to some embodiments.
Figure 8B:
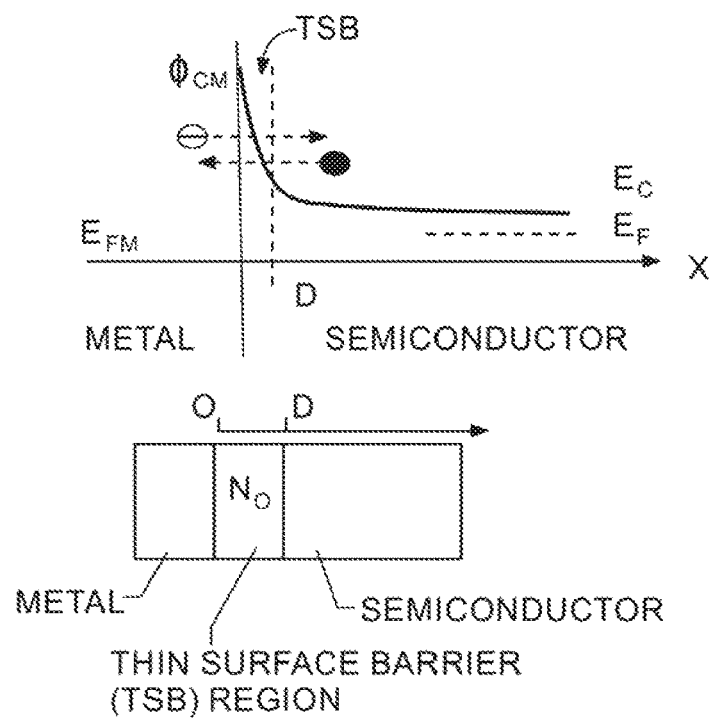
FIG. 8B illustrates a thin surface barrier (TSB) model of a semiconductor surface.

The current-voltage characteristic of the monolithic integrated LED-SBD 100 shows a high breakdown up to 200 voltages and a low forward bias of 1.8 V at 20 mA (see FIG. 8A). The representative reverse leakage current of the SBDs 104 can be kept below 10 μA at the reverse bias of 100V. Generally, ICP etching of III-nitride materials can induce a large number of nitrogen donor vacancies at the metal-semiconductor interfaces. These defect donors could sharpen the potential profile near the semiconductor surface, leading to the formation of thin surface barrier (TSB) region, as shown in FIG. 8B. The top part of FIG. 8B illustrates the tunneling of carriers through a Schottky barrier. The tunneling process can be significantly augmented when the Schottky barrier becomes thin at the presence of high-density nitrogen vacancies. For example, nitrogen vacancies may function as donor dopants in III-nitride semiconductors. Large leakage current may result from the increased probability of electron tunneling. The results of the SBD 104 measurement and device modeling agree well, and suggest that the TSB-induced degradation SBD 104 performance can be effectively avoided with the aforementioned three-step etching and surface passivation process.

To test the feasibility of integrating III-nitride power electronic components with LEDs monolithically for potential applications in solid state lighting with on-chip drivers, free space communication using LED lamps, etc., the effect of the interfacial region lying in between undoped GaN layers and buffer-layers on the forward current properties of lateral-type GaN Schottky diodes and planar GaN metal-semiconductor-field-effect-transistors (MESFETs) grown on sapphire substrates can be investigated. Experimental results reveal higher current densities for devices grown on patterned sapphire substrates (PSS) compared to flat sapphire substrates (FSS). This may be due to different carrier transport properties of the interfacial regions. Simulations using a charge transport model show a good agreement with the experimental results.

In some embodiments, the interfacial region may be configured to act as a channel in which the current passes in between the device metallic contacts. The presence of the interfacial regions can cause the lateral Schottky diodes to exhibit high current densities without a change in their on-state-voltage. It was discovered that planar MESFETs could hardly reach cut-off or show saturation behavior. Studying the effect of the interfacial region on the operation of GaN power devices may be done to optimize the device design and efficiency. Studying the effect of the interfacial region on the operation of GaN power devices may be also done to facilitate their monolithic integration with GaN-based LEDs.

Growing GaN layers on sapphire substrates can allow for the production of high quality blue LEDs compared with that grown on silicon substrates of similar surface areas. With both sapphire and silicon substrates, a buffer layer may be used to relieve the strain produced from any lattice mismatch that may occur between the substrate and the GaN layer. Yet, silicon substrates may suffer from high defect density that may further lead to high leakage current and low LED efficiency. For GaN layers grown on sapphire substrates, the buffer layer could be aluminum nitride (AlN), low temperature grown (LT) GaN, or LT-GaN atop a AlN layer. The undoped GaN epitaxially grown on sapphire substrates using metal-organic chemical vapor deposition (MOCVD) can exhibit n-type conductivity with a representative carrier concentration around $5\times10^{16}$ cm$^{-3}$. The n-type conductivity may be attributed to the diffusion of oxygen impurities from the sapphire substrate and/or the unintentional oxygen impurity introduction during growth. In particular, the oxygen impurity concentration may be remarkably high at the undoped GaN/buffer layer interface. This interface region can be very thin (e.g., a few tens of nanometers for PSS or just few nanometers for FSS). This interface region, although thin, may possess much higher background doping than an undoped GaN upper layer.

The effect of the undoped GaN/buffer layer interfacial region on the operation of GaN Schottky diodes and planar MESFET devices can be studied. A charge transport model may be used to predict the operation of the devices and compare with the experimental results. This may facilitate a feasibility study of integrating III-nitride power electronic components with LEDs monolithically for the potentials in solid state lighting with on-chip drivers, free space communication using LED lamps, etc. In one embodiment of the study, GaN lateral Schottky diodes and planar MESFET devices may be monolithically integrated with LEDs. The current-voltage (IV) characteristics of those devices can be measured. In order to provide a better understanding of the measured IV curves, these device designs may be simulated using Sentaurus TCAD™ software. This software may be configured to implement a simple charge transport model that can take into account the drift and diffusion of the majority charge carriers inside the devices.

The devices may be fabricated on 2-inch commercial LED epi-wafers. These LED epi-wafers may be grown on c-face (0001) sapphire substrates 301 by metal-organic chemical vapor deposition (MOCVD), for example. One device can be grown on a PPS 300. One device can be grown on a FSS. Each device's epitaxial structure can include, from top to bottom, an approximate 200 nm p-type GaN capping layer (not shown), an approximate 200 nm p-type GaN layer 302, an approximate 125 nm MQW emissive layer 304 including fifteen pairs of In$_{0.1}$Ga$_{0.9}$N/GaN, an approximate 2.4 μm n-type (Nd of approximately $1\times10^{18}$ cm$^{-3}$) GaN layer 306, and an approximate 2.5 μm unintentionally-doped (Nd of approximately $3\times10^{16}$ cm$^{-3}$) GaN layer 308 on a the sapphire substrate 300.

The fabrication process flow of the devices can begin with dry etching using a Cl2/Ar ICP cyclic etching process to the nGaN layer 306. ICP RIE may provide more isotropic etch profiles and/or low-damage high etch rates compared to conventional RIE. After removing the upper layers, ICP etching to sapphire may be performed. This may be followed by ICP etching to the undoped GaN layer. To optimize the performance of the Schottky contacts 312, at least a portion of the devices can be soaked into a KOH solution for 10 min before the Schottky metal deposition. This KOH treatment may remove any surface defects produced by the ICP etching process and/or reduce the leakage current. Following the KOH treatment, the devices can be annealed using rapid thermal annealing (RTA) tool in $N_2$ with a flow rate 5 sccm at temperature 700° C. for 2 min. An ohmic contact 314 can be deposited on the n-type GaN layer 306 by evaporating Ti/Al/Ti/Au with thicknesses 10 nm/40 nm/40 nm/200 nm and annealed using RTA in nitrogen at temperature 500 C for 1 min, while the Schottky contact 312 can be deposited on the undoped GaN layer by evaporating with thicknesses 40 nm/100 nm Ni/Au. FIGS. 9A-9D show schematics of two GaN device designs that may be used in the feasibility study. The I-V characteristics of these devices can be measured using a Keithley 2612 analyzer at the ambient pressure and temperature.

Experiments may be performed in order to examine the effect of the interface layer 310 between the undoped GaN layer and the sapphire substrate layer 300. Simulations using the charge transport model can be implemented to investigate the influence of the interface region 310 on the IV characteristics of the GaN Schottky diodes and MESFETs.

As mentioned previously, the interface layer 310 may contain a remarkably high n-type impurity concentration and dislocation defect density. This interfacial layer 310 may potentially affect the lateral current transport in the fabricated devices. In the simulations, the carrier concentration of the interface layer 310 may be considered to be $1 \times 10^{19}$ cm$^{-3}$ with 35 nm thickness atop the PSS 300, whereas for the FSS sample, the carrier concentration of the interface layer may be considered to be $3 \times 10^{16}$ cm$^{-3}$ with 5 nm thickness. In addition, the carrier concentration of the undoped GaN layer can be $3 \times 10^{16}$ cm$^{-3}$ with a thickness of 1.5 µm. This configuration may suggest that the dislocation-induced current path would mainly flow through the interface layer 310, which can significantly increase the forward bias current density of the Schottky diode while maintaining high breakdown voltage.

Figure 9A:
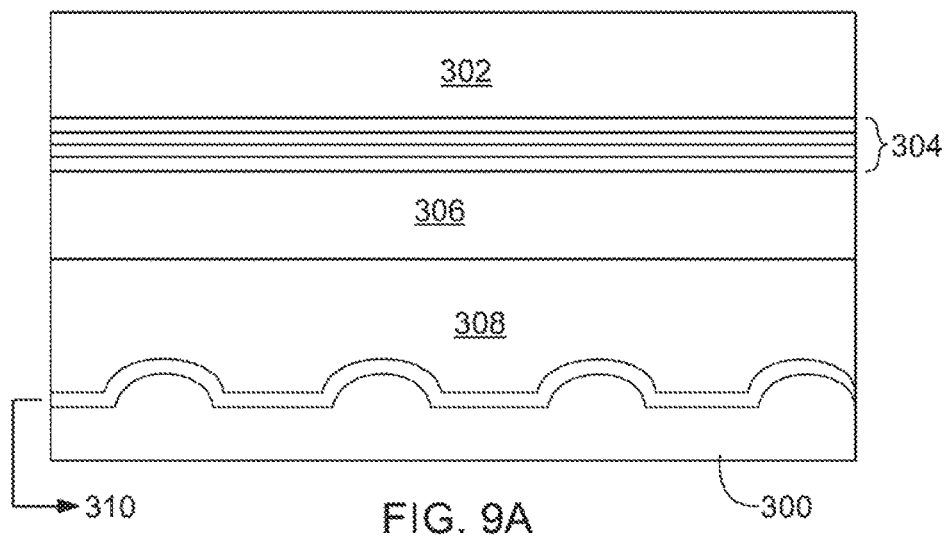
FIGS. 9A-9D show GaN device designs, where
Figure 9B:
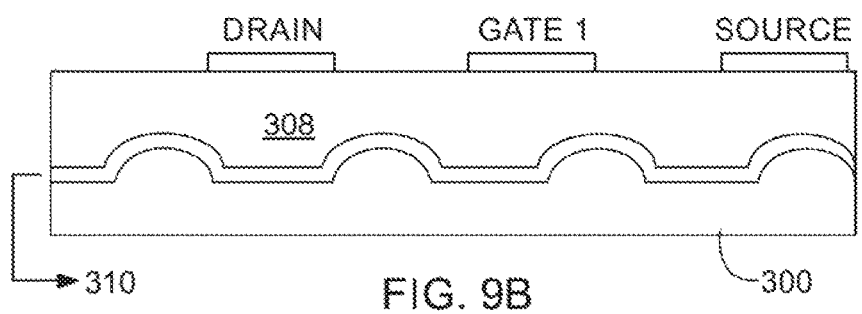
Figure 9C:
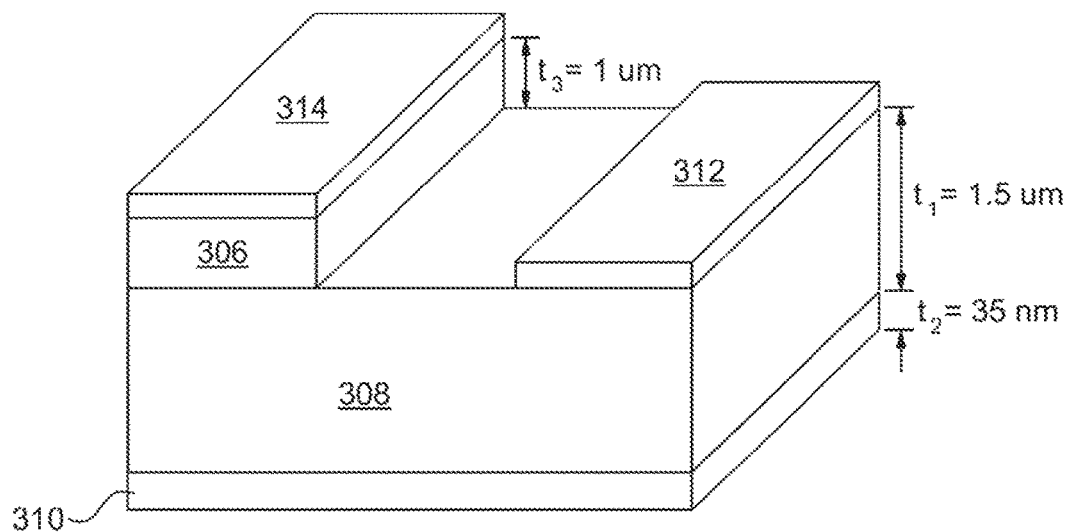
Figure 10:
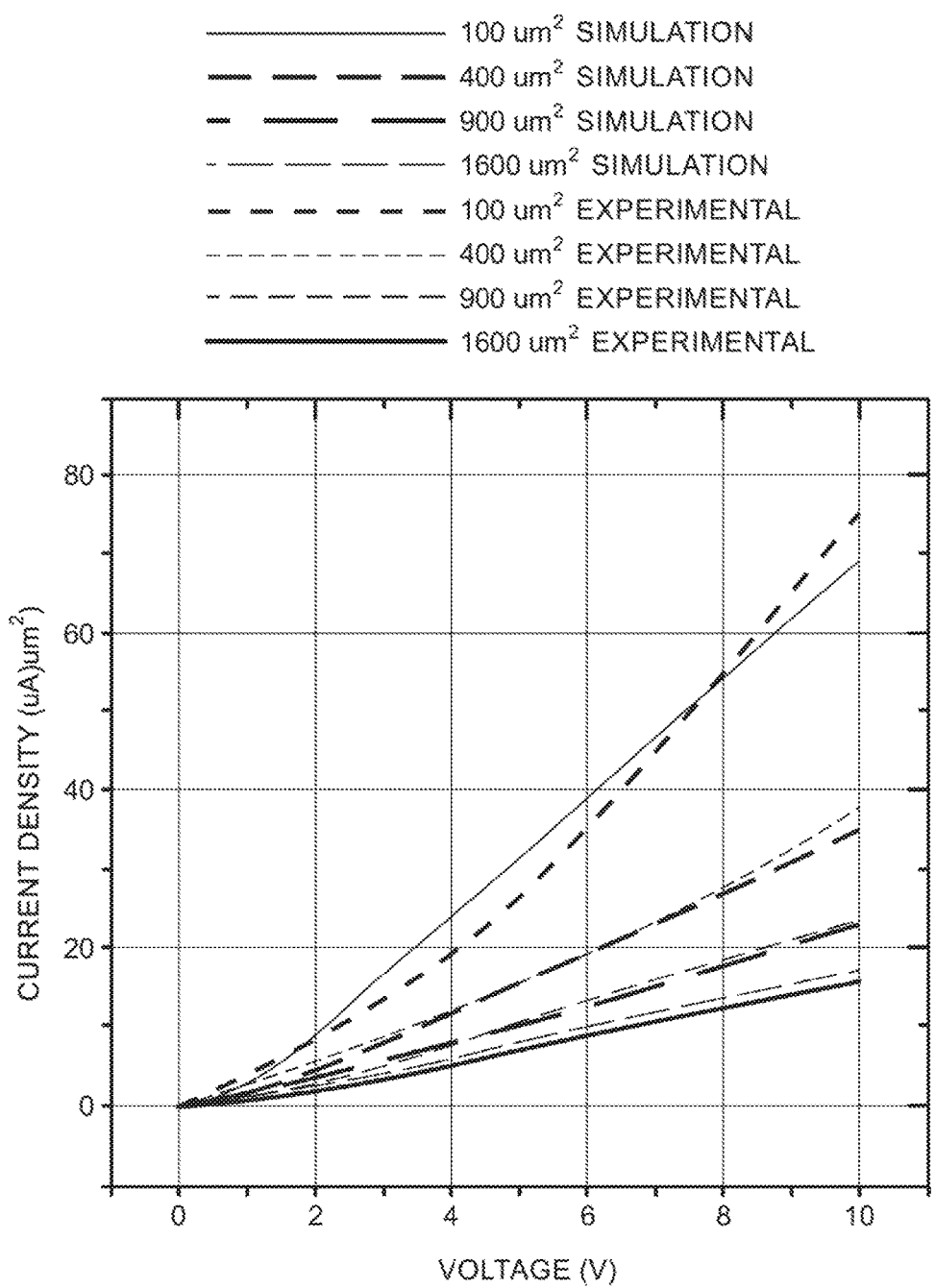
FIG. 10 shows experimental and simulation forward I-V curves for Schottky diodes, each having different contact areas.
Figure 11A:
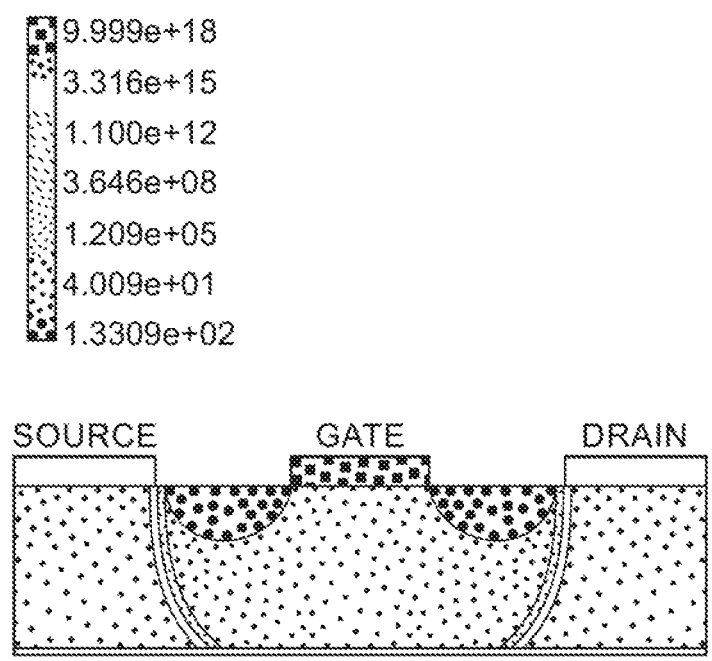
FIG. 11A shows the electron-density for a 2-D planar metal-semiconductor-field-effect-transistor while the gate is under reverse bias Vg=−400 V.
Figure 11B:
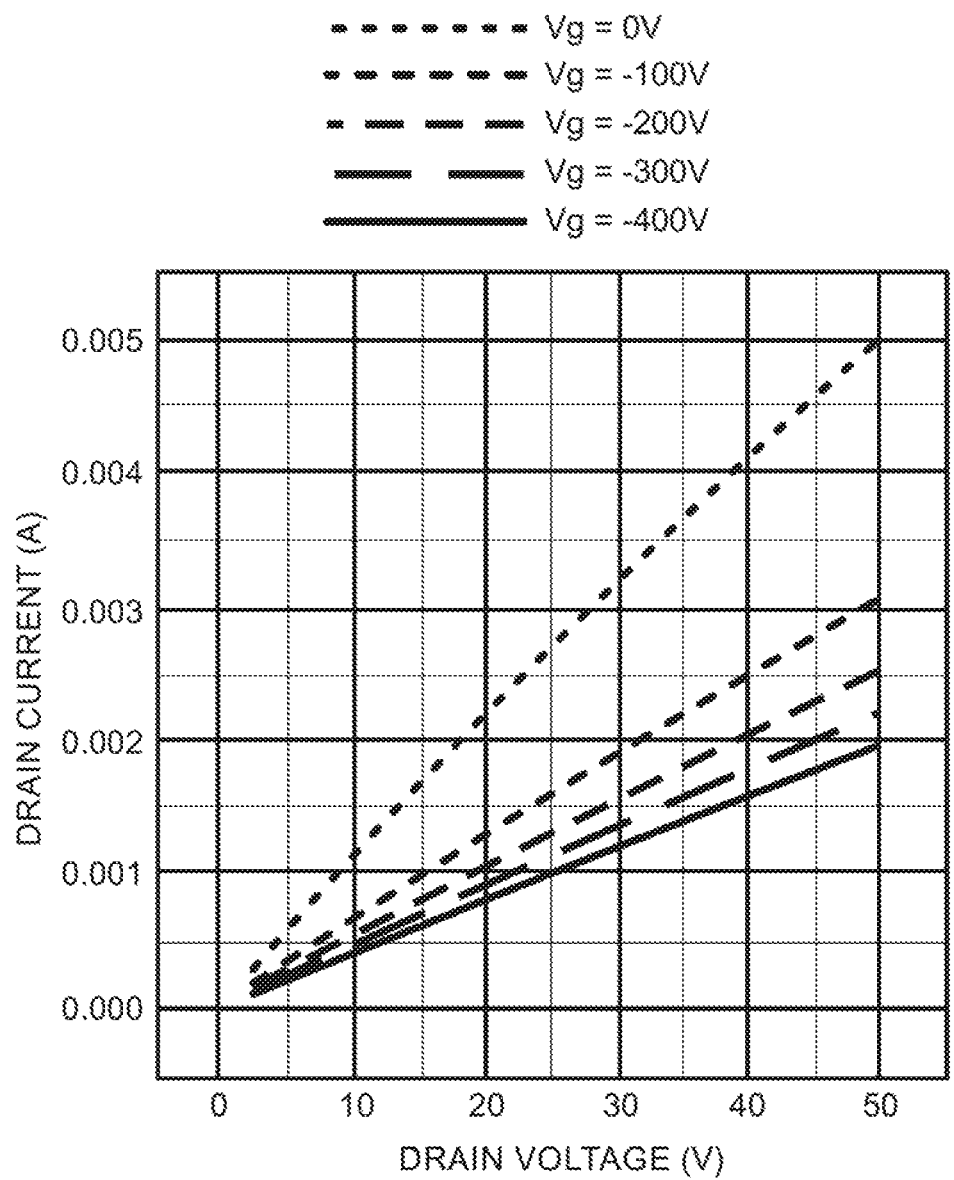
FIG. 11B shows the drain current $I_{ds}$ of the metal-semiconductor-field-effect-transistor device versus the drain voltage $V_{ds}$.

The comparison between the experimental and simulation results of the GaN Schottky devices grown on PSS 300 with different Schottky contact areas is shown in FIG. 10. The contact areas may be (100 µm$^2$, 400 µm$^2$, 900 µm$^2$, and 1600 µm$^2$). It can be inferred from FIG. 10 that the current density may be much higher for the smallest contact area and it can decrease as the area of the Schottky diode increases. However, the smaller contact area devices may be expected to have lower breakdown voltages, which can indicate that the Schottky contact areas should neither be too small nor too large. One of the challenges in fabricating a GaN based MESFET on commercial LED epi-wafer using conventional planar structure can be the existence of LT GaN buffer layer between the unintentionally doped GaN layer 308 and the sapphire substrate 300, as shown in FIGS. 9B and 11A. The LT GaN buffer layer can be highly conductively near the sapphire interface. This may make the full depletion of conventional horizontal channel MESFET unfeasible even at very high reverse gate bias $V_g$=−400 V and the MESFET device would neither reach saturation nor cut-off, as shown in FIG. 11B.

Figure 12:
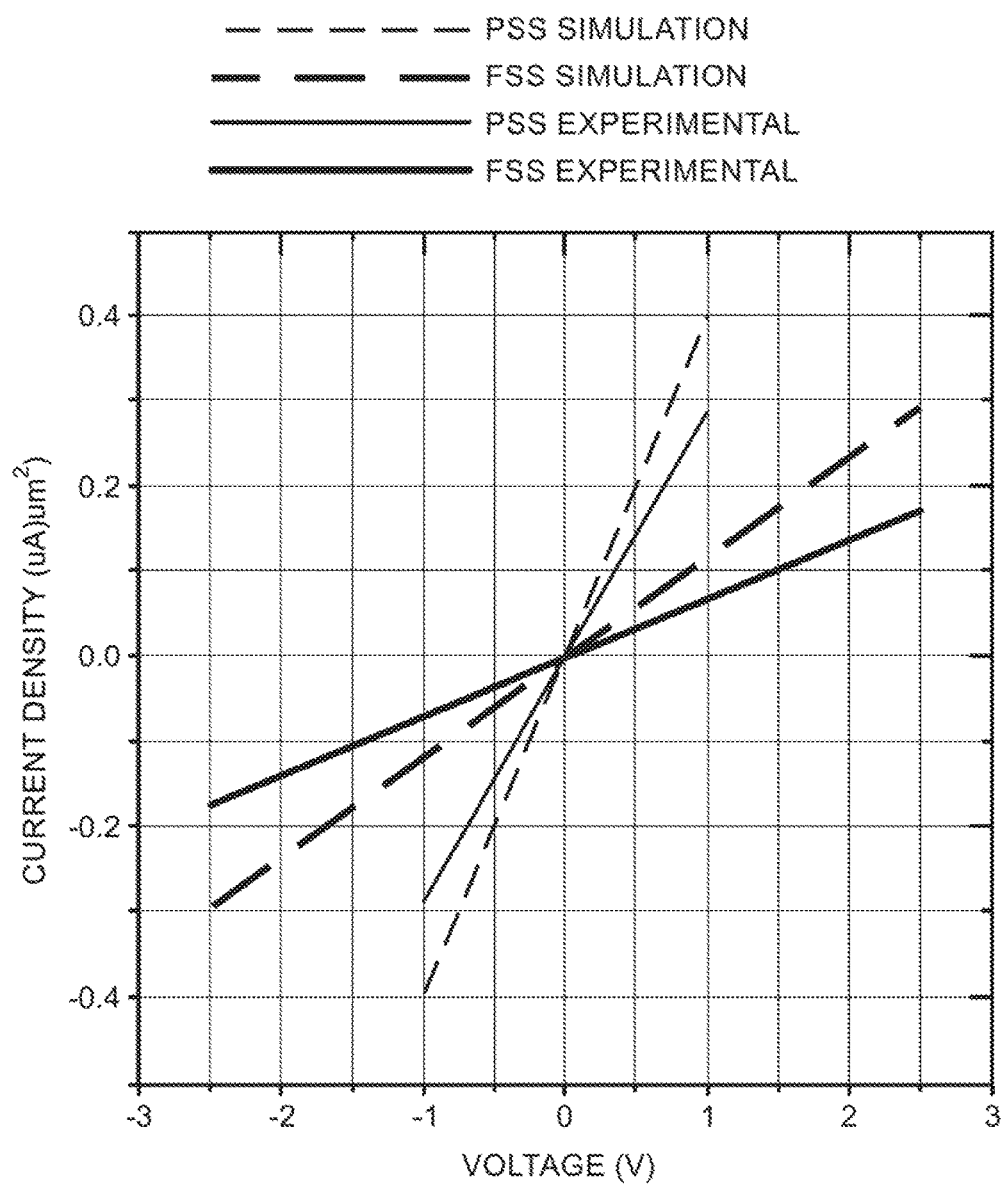
FIG. 12 shows a comparison of measured and calculated current densities of Ohmic contacts fabricated on a patterned sapphire substrate (PPS) and a flat sapphire substrate (FSS).

The ohmic behavior of the interfacial regions 310 atop PSS 300 and FSS is illustrated in FIG. 12. Four-point resistance measurement can be applied between the two ohmic contacts 314 with a distance of 400 µm on both PSS and FSS devices. FIG. 12 depicts the high resistivity of 4.2 Ω·cm of the interfacial layer 310 in case of FSS device compared to a smaller resistivity of $8 \times 10^{-3}$ Ω·cm for the PSS device.

Figure 9D:
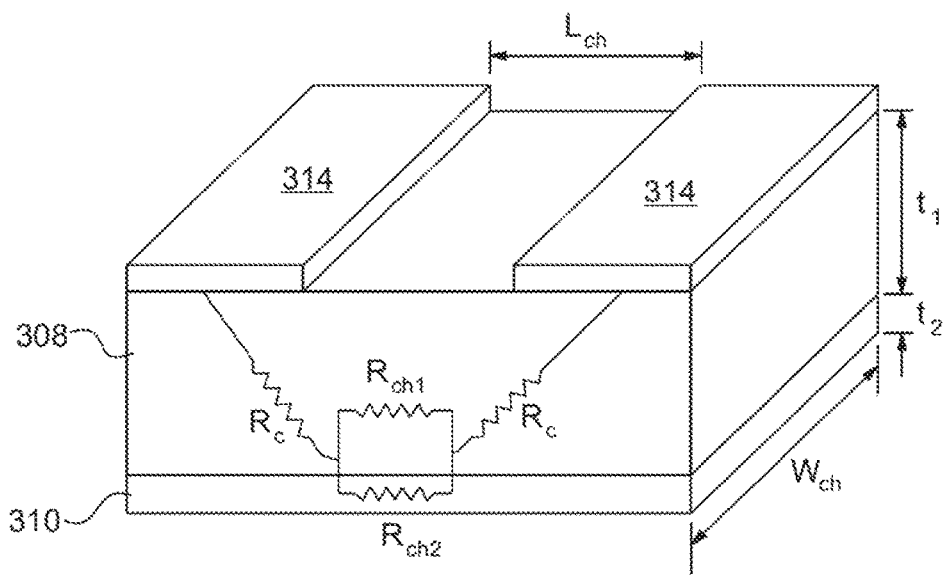

The total resistance can consist of the contact resistances and the channel resistance as shown in FIG. 9D. The channel resistance could be calculated using the known resistance of the undoped GaN region, which can be in parallel with the resistance of the interface region 310. The resistance of the undoped GaN region and the interface region can be expressed as:

$$R_{chi} = \frac{1}{(qn_i u_i)} \frac{L_{ch}}{(W_{ch} t_i)}$$

where i=1; 2 for the undoped GaN and the interfacial region 310, respectively. $L_{ch}$ is the length of the conductive channel, $W_{ch}$ is the width of the conductive channel, $n_i$ is the average doping concentration, $u_i$ is the average mobility, and $t_i$ is the thickness of the region. For both the PSS and the FSS devices, $L_{ch}$ can be 400 µm and $W_{ch}$ can be 230 µm. By subtracting the contact resistances, the channel resistance can be 2.5 kΩ for the PSS device and 3.5 kΩ for the FSS device.

The mobility can be calculated using the GaN doping dependence mobility model and the Caughey-Thomas approximation:

$$u_i = 55 + \frac{945}{1 + \frac{n_i}{2r10^{17}}}$$

Figure 13A:
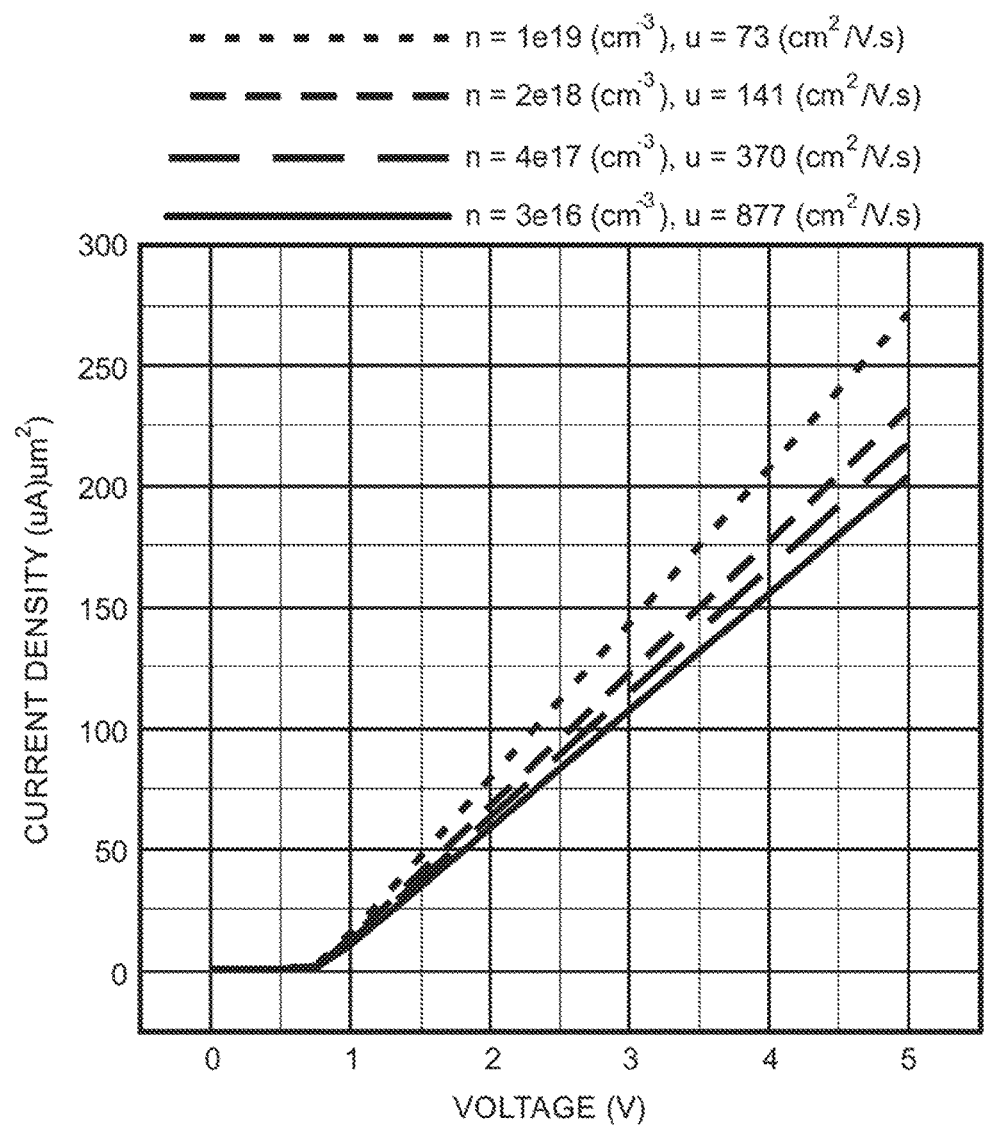
FIG. 13A shows simulated I-V curves of a Schottky diode while the carrier concentrations of the interfacial region are changed.
Figure 13B:
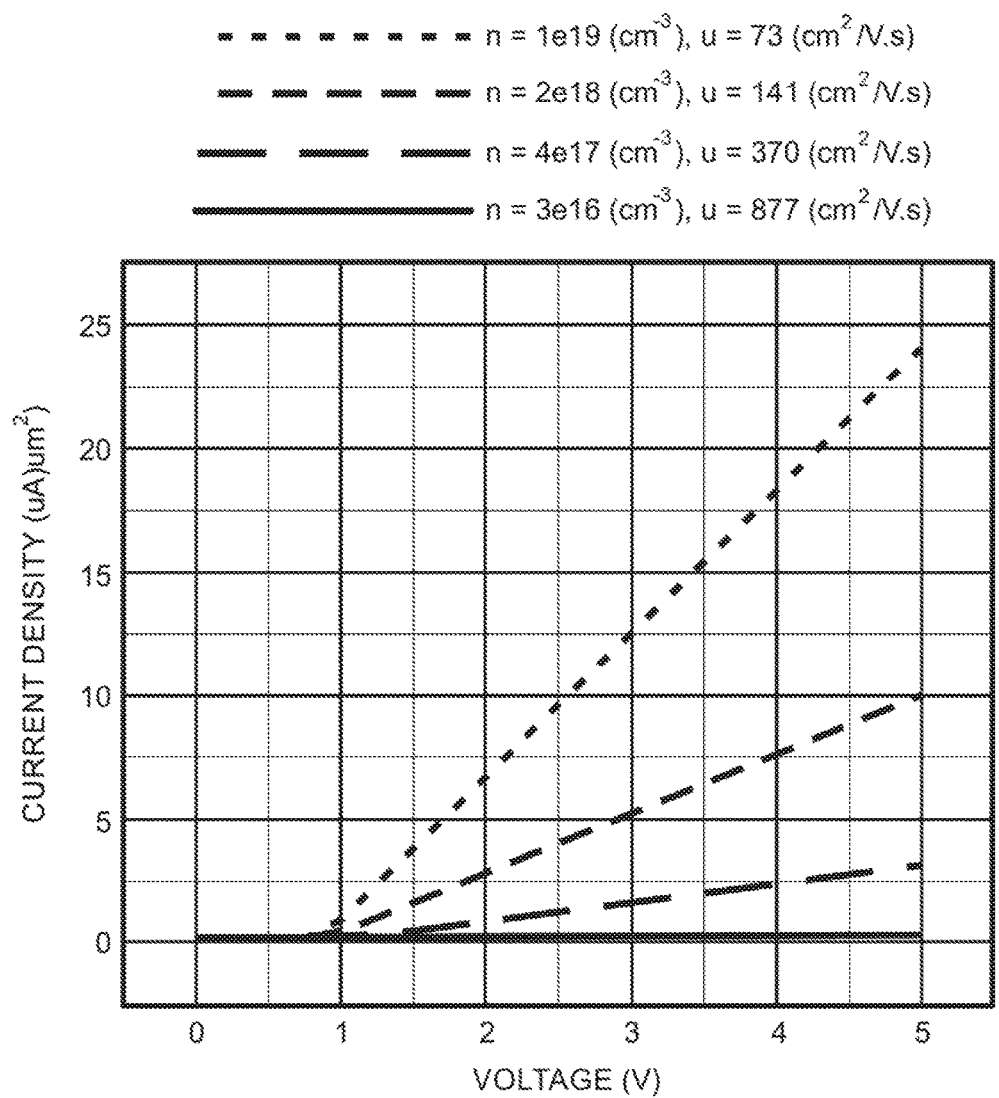
FIG. 13B shows simulated I-V curves for changing the carrier concentrations at the undoped GaN layer.

The Caughey-Thomas approximation can be a good fitting for IV curves of ohmic contacts 314 with different spaces on both PSS and FSS devices. The parameters that can be used for the PSS devices may be $t_i$=1.5 µm, $t_2$=35 nm, n1=$3 \times 10^{16}$ cm$^{-3}$, $n_2$=$1 \times 10^{19}$ cm$^{-3}$. The parameters for the FSS devices can be $t_1$=1.5 µm, $t_2$=5 nm, $n_1$=$3 \times 10^{16}$ cm$^{-3}$, $n_2$=$3 \times 10^{16}$ cm$^{-3}$. The increase of the carrier concentration in the PSS devices may be attributed to the movement of the oxygen into the GaN layer by thermal etching and/or diffusion during the initial growth stage, which may lead to increased roughness of the PSS device compared to the FSS device. By using the aforementioned mobility model, the effect of varying the carrier concentration of the undoped GaN region and the interfacial region 310 on the threshold on-state voltage of the Schottky diodes can be investigated. FIG. 13A shows the current density of the Schottky diode while changing the carrier concentrations of the interfacial region 310, keeping the carrier concentration of the undoped GaN layer constant. The curves show that the on-state voltage of the Schottky diodes is independent of the interfacial region 310. However, by changing the carrier concentration of the undoped GaN layer while keeping the carrier concentration of the interfacial region 310 constant, as shown in FIG. 13B, the on-state-voltage of Schottky diodes can be significantly altered.

Figure 14A:
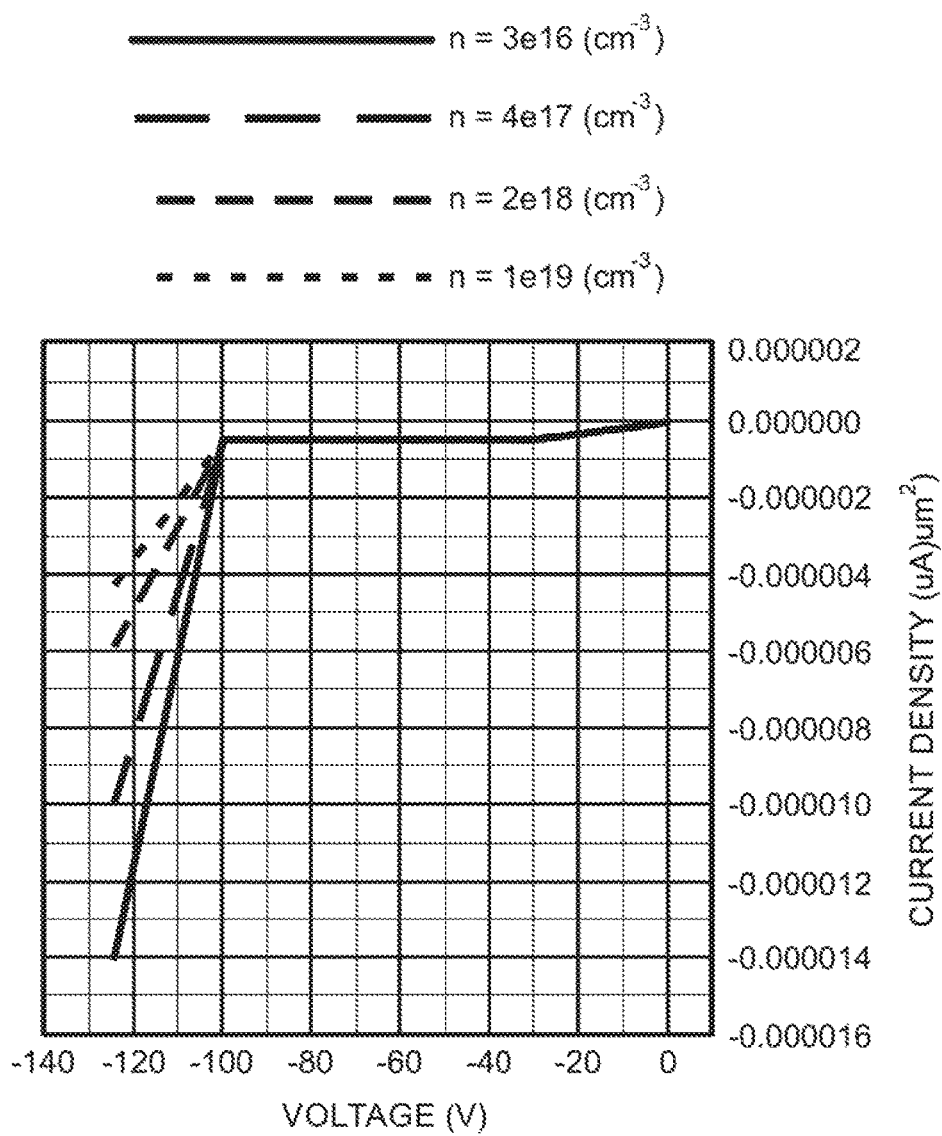
FIG. 14A shows reverse bias characteristics for different doping levels of the interface layer.
Figure 14B:
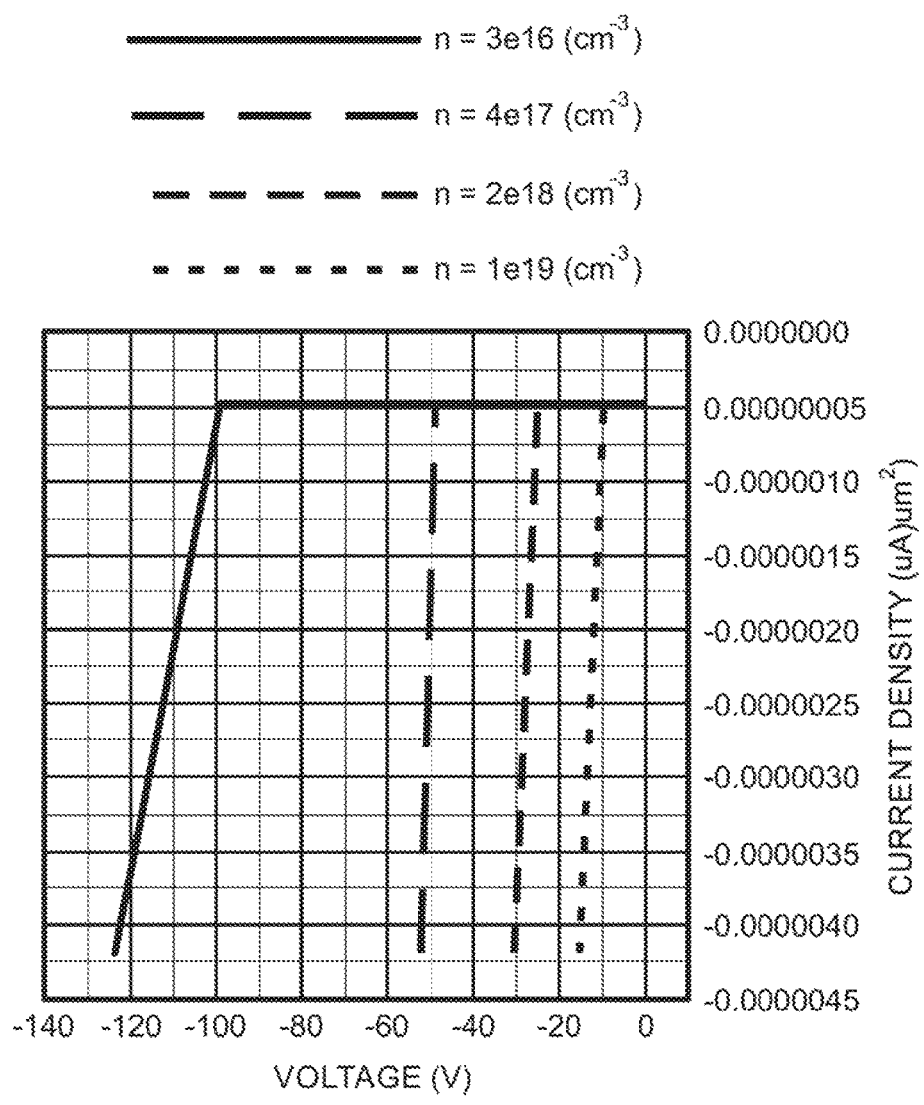
FIG. 14B shows reverse bias characteristics for different doping levels of the undoped GaN layer.

On the other hand, the reverse current properties may not be influenced by the highly conductive interface layer 310 as shown in FIG. 14A. This interfacial layer 310 may have helped in increasing the forward currents of the Schottky diodes while retaining a high breakdown voltage around −100V. By this approach, Schottky diodes may be designed of both large breakdown and high forward currents. This may be useful for power electronics applications. Without this highly conductive interface layer 310, the conventional approach to increase the forward current of this lateral conduction Schottky device may to increase the background doping level of the undoped GaN layer. The increased background doping may decrease the breakdown voltage as shown in FIG. 14B. This may make conventional devices not suitable for operation under high voltage conditions. Yet, high voltage conditions can often be encountered in many power electronic applications.

Figure 15:
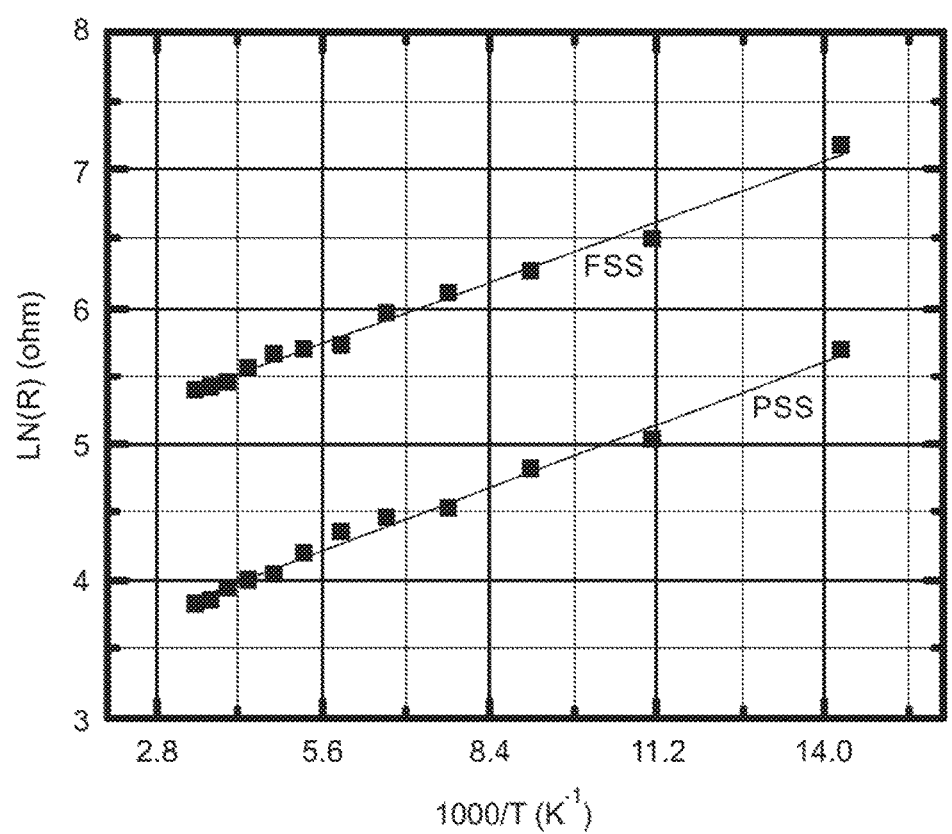
FIG. 15 shows the measured resistance for a patterned sapphire substrate (PSS) Ohmic device and a flat sapphire substrate (FSS) Ohmic device, each as a function of temperature.

The measured resistance for PSS and FSS Ohmic devices as the function of temperature is shown in FIG. 15. The temperature can be varied over the range 290K to 70K. The contact resistances may be deducted from the total resistances by transmission line method (TLM) measurements. It can be inferred from the ln(R)-T curves that the conductance of PSS devices may be more than 5 times higher than that of the FSS devices. Herein, the resistance R and the carrier activation energy E, at low temperature can be given by:

$$R(T) = R_0 \exp\frac{\Delta E}{2kT}$$

The activation energies may be 30 meV and 29 meV for the PSS device and the FSS device, respectively. These may be obtained from the slope of the ln(R)-T curve, as shown in FIG. 15. Since the ionization energies of both oxygen and nitrogen vacancies are reported as 29 meV, 29.3 meV, and 30 meV, FIG. 15 may suggest that oxygen and/or nitrogen vacancies can be the possible impurity species in the interfacial region 310.

With this exemplary study, the effect of the u-GaN/buffer-layer interfacial region on the operation of GaN Schottky diode and MESFET device may be been investigated. Simulation results for the fabricated designs of the Schottky diode and MESFET may be used to better understanding the experimentally measured IV characteristics and/or for proposing a more power efficient design for the MESFET. The measured IV curves of Schottky diodes grown on PSS devices possessing different contact areas can be compared with their calculated counter parts. Similarly, the Ohmic characteristics of undoped GaN layer grown on the PSS can be compared with one grown on the FSS. In addition, a simulation of varying the carrier concentration of the undoped GaN region and the interfacial region 310 can be used in determining their effect on the on-state-voltage of the Schottky diode. The following inferences may be drawn:
(i) The Schottky diode with larger Schottky contact area may exhibits lower current density compared with the smaller contact area diodes, despite that they are all significantly higher than the case with no interfacial region.
(ii) The PSS can provide a thicker interfacial layer 310 and higher current densities compared to the FSS.
(iii) For the Schottky diode, the on-state-voltage can be independent on the existence of the interfacial region 310; however, the carrier concentration of the undoped GaN may play a major role in determining it.
(iv) Owing to the existence of the high impurity concentration interfacial region, a MESFET with a planar design can hardly reach cut-off and the very high gate biases may be required to see significant change in the IV curves.
(v) The conductance of the PSS device can be 5 times higher than that of FSS device at the same temperature.

Understanding the effect of the interfacial layer 310 on the operation of GaN power devices may be used to optimize their designs and integrating them with GaN-based LEDs. For example, use of patterned sapphire substrates 300 can further reduce the power consumption of on-chip current rectifiers by increasing the diode current density using the interface defect-induced current without the cost of degraded breakdown performance.

Additional Embodiments

In some embodiments, the integrated LED-SBD 100 may include III-nitride LEDs.

In some embodiments, the LED wafer 103 may be a 2-inch, commercially available LED epiwafer. In some embodiments, the substrate 101 of the LED wafer 103 may be a patterned sapphire substrate 300.

In some embodiments, the AC LED 102 may have a mesa dimension of 300 μm×300 μm.

In some embodiments, the integrated LED-SBD 100 may include an indium-tin-oxide (ITO) current spreading layer formed on the p-type GaN layer of the LED wafer.

In some embodiments, the SBD 104 may include a Schottky contact 126 deposited on the surface of a recess-etched portion of the LED wafer's 103 GaN buffer layer 112. In some embodiments, the SBD 104 may include at least one Ohmic contact 124 deposited on the surface of the LED wafer's 103 n-type GaN layer 118. In some embodiments, at least one Ohmic contact 124 of the SBD 104 can include one or more layers of Cr, Pt, and/or Au.

In some embodiments, the SBD 104 may be structured as illustrated in FIG. 2, with Ohmic contacts 124 on the un-doped GaN buffer layer 112 on either side of an n-type GaN layer 114. In some embodiments, the SBD 104 may be structured with a single Ohmic contact 124 on the un-doped GaN buffer layer 112 so as to be on one side of an n-type GaN layer 114.

In some embodiments, the LED wafer 103 may be structured as illustrated in FIG. 2, with a p-type GaN layer 118 below the MQW layer 116, and a p-type GaN layer 118 above the MQW layer 116. In some embodiments, the LED wafer 103 may be structured with no p-type GaN layer 118 between the n-type GaN layer 114 and the MQW layer 116.

Figure 7A:
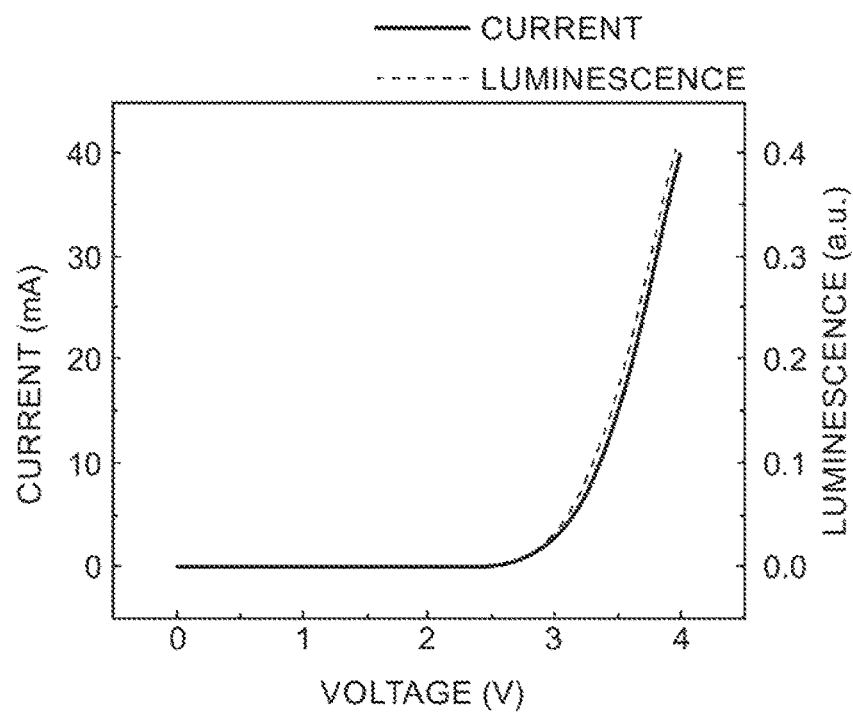
FIG. 7A is a graph of a luminescence-current-voltage (L-I-V) characteristic of an embodiment of an integrated LED-SBD, according to some embodiments.
Figure 7B:
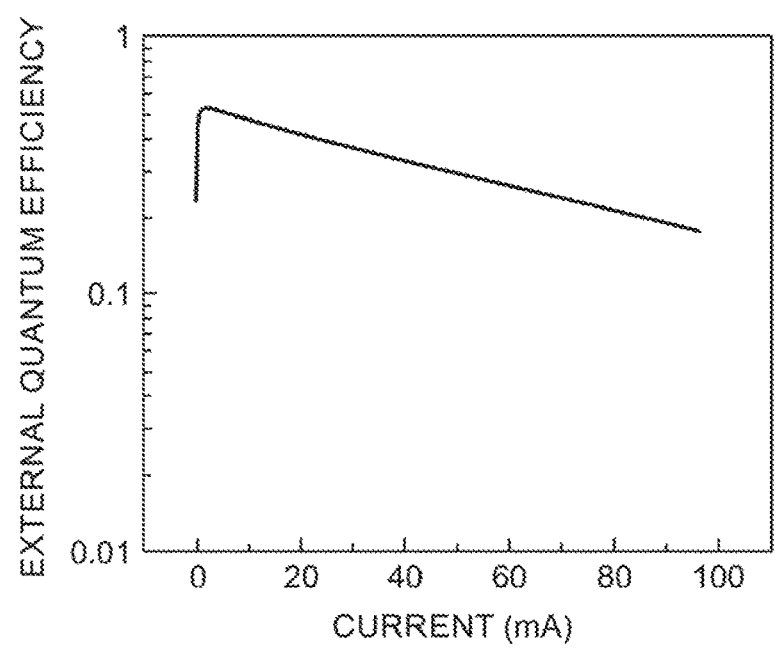
FIG. 7B is a graph of the external quantum efficiency-current characteristics of an embodiment of an integrated LED-SBD, according to some embodiments.

In some embodiments, the performance of the integrated LED-SBD 100 may correspond to FIGS. 7A and 7B, which illustrate a forward working voltage of 3.67 V at 40 mA and a peak external quantum efficiency of 53%.

In some embodiments, the performance of an SBD 104 may correspond to FIG. 8A, which illustrates a reverse-biased breakdown voltage of up to 200 V, a forward biased working voltage of 1.8 V at 20 mA, and a reverse biased leakage current below 10 μA at a reverse-bias voltage of 100 V.

In some embodiments, the fabrication technique disclosed herein may yield an SBD 104 with reduced etching defects (relative to a conventional SBD fabrication process). In some embodiments, the fabrication technique disclosed herein may inhibit the formation of a thin surface barrier (TSB) region between the SBD's 104 metal contacts and the underlying semiconductor layers, and/or reduce the performance degradation associated with the formation of a TSB region.

According to an aspect of the present disclosure, an AC LED light source 102 device may be provided. In some embodiments, the light source 102 device may comprise one or more LEDs (e.g., an array of LEDs) monolithically integrated on a chip with circuitry (e.g., power electronic circuitry configured to drive the one or more LEDs). In some embodiments, the light source 102 device may be used for general lighting, used for public lighting, included in a street light, television backlight, liquid crystal display backlight, garden light, building light, garage light, indoor light, storage light, street light, automobile light, garage lamp, industry light, and/or flash light. In some embodiments, the light source 102 device may be less expensive to produce, may have a longer average life expectancy, and/or may be more compact in size than conventional LED-based light sources.

According to an aspect of the present disclosure, a fabrication method can be provided. The fabrication method may include exposing an n-type GaN layer 114 using ICP dry etching. The fabrication method may further include growing a thin oxide layer 130 of $Ga_2O_3$ by dry oxidizing a surface of a LED wafer 103. The dry etching may include inductively coupled plasma reactive-ion etching system. The fabrication method may further include treating the dry etched surface with KOH solution under intense ultraviolet illumination. The fabrication method may further include repeating the last three processes until the un-doped GaN layer 112 is exposed. The fabrication method may further include annealing at 850° C. for 2 minutes in a $N_2$ atmosphere with a rapid thermal annealing system. The fabrication method may further include passivating at least a portion of the LED wafer 103 in $(NH_4)_2S$:Isopropanol (IPA) 1:10. The fabrication method may further include depositing a Ohmic contact 124 metal of Ti/Al/Ti/Au on the exposed surface of n-type GaN layer 114. The fabrication method may further include annealing at 500° C. for 1 minute in a $N_2$ atmosphere with a RTA system. The fabrication method may further include depositing the Schottky contact 126 metal of Ni/Au on the exposed surface of un-doped GaN buffer layer 112. In some embodiments, the fabrication method can be used for fabricating a monolithically integrated LED-SBD 100 with high breakdown voltage and low forward biased working voltage on commercial available GaN LED wafers 103.

In some embodiments of the fabrication method, the LED wafer 103 can have a top-emission structure.

In some embodiments of the fabrication method, the LED wafer 103 can have a flip-chip structure.

In some embodiments of the fabrication method, the Schottky contact 126 can be formed on the un-doped GaN buffer layer 112. The Ohmic contact 124 can be formed on the n-type GaN layer 114.

In some embodiments of the fabrication method, the Schottky contact 126 surface can be exposed using a mixed etching technique. The mixed etching technique can include growing a thin oxide layer 130 of $Ga_2O_3$ by dry oxidizing a surface of the LED wafer 103. The mixed etching technique can further include dry etching at least a portion of the LED wafer 103 with an inductively coupled plasma reactive-ion etching system. The mixed etching technique can include treating the dry etched surface with KOH solution under ultraviolet illumination.

In some embodiments of the fabrication method, the Schottky contact 126 surface can be exposed employing several mixed etching cycles.

In some embodiments of the fabrication method, at least some etched portions of the LED wafer 103 can be annealed at 750° C. for 2 minutes in a $N_2$ atmosphere with a rapid thermal annealing system. The fabrication method can further include passivating at least a portion of the LED wafer 103 in $(NH_4)_2S$:Isopropanol (IPA) 1:10 for 1 minute.

In some embodiments of the fabrication method, there is only one SBD 104 on each arm 108, 110 of the WB circuit 106.

It should be understood that various combinations of the structures, components, materials and/or elements, in addition to those specifically shown in the drawings and/or described in the present disclosure, are contemplated and are within the scope of the present disclosure. Reference throughout the specification to "one embodiment" or "an embodiment" or "some embodiments" means that a particular feature, structure, material, or characteristic described in connection with the embodiment(s) is included in at least one embodiment of the present invention, but not necessarily in all embodiments. Consequently, appearances of the phrases "in one embodiment," "in an embodiment," or "in some embodiments" in various places throughout the disclosure are not necessarily referring to the same embodiment. Furthermore, the particular features, structures, materials, or characteristics can be combined in any suitable manner in one or more embodiments.

It should be understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment, but not necessarily in all embodiments. Consequently, appearances of the phrases "in one embodiment," "in an embodiment," or "in some embodiments" in various places throughout the Specification are not necessarily referring to the same embodiment.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to," Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

What is claimed is:

1. An integrated circuit comprising:
a rectifier circuit configured to couple to an alternating current (AC) supply, the rectifier circuit comprising a Wheatstone bridge circuit made from a plurality of Schottky barrier diodes (SBDs), each SBD having a reverse-bias breakdown voltage substantially equal to or greater than half a peak voltage of the AC supply;
at least one light emitting diode (LED) coupled to the rectifier circuit; and
a substrate on which the rectifier circuit and the at least one LED is formed, wherein the substrate is a patterned sapphire substrate with an interface layer on the patterned sapphire substrate, and the interface layer is configured to increase a forward bias current density of at least one SBD.

2. The integrated circuit of claim 1, wherein the substrate comprises at least one of a gallium nitride (GaN) substrate and a sapphire substrate.

3. An integrated circuit comprising:
a substrate comprising at least one of gallium nitride (GaN) and sapphire;
at least one light-emitting diode (LED) formed on the substrate; and
a rectifier circuit coupled to the at least one LED, the rectifier circuit comprising a Wheatstone bridge circuit made from a plurality of Schottky barrier diodes (SBDs) formed on the substrate the rectifier circuit being configured to couple to an alternating current (AC) supply;
wherein each SBD has a reverse-bias breakdown voltage substantially equal to or greater than half a peak voltage of the AC supply;
wherein the substrate is a patterned sapphire substrate with an interface layer on the patterned sapphire substrate configured to increase a forward bias current density of at least one SBD.

4. The integrated circuit of claim 3, wherein the at least one LED and the plurality of SBDs are monolithically integrated on the substrate.

5. A method of producing an integrated circuit, the method comprising:
forming an alternating current light emitting diode (AC LED) on a wafer, the wafer comprising a substrate, a buffer layer and an n-type layer;
etching at least a portion of the wafer to expose at least a portion of the buffer layer and at least a portion of an n-type layer;
at least one of annealing and passivating at least a portion of the wafer;
depositing an Ohmic material on at least a portion of the n-type layer;
depositing a Schottky material on at least a portion of the buffer layer;
forming a rectifier circuit configured to couple to an alternating current (AC) supply, the rectifier circuit comprising a Wheatstone bridge circuit made from a plurality of Schottky barrier diodes (SBDs), each SBD having a reverse-bias breakdown voltage substantially equal to or greater than half a peak voltage of the AC supply; and
coupling the rectifier circuit to the AC LED;
wherein etching at least a portion of the wafer to expose at least the portion of the buffer layer further comprises performing at least one cycle of processing, each of the at least one processing cycle comprising:
growing a layer of an oxide on at least a portion of the n-type layer; and
etching at least a portion of the wafer to remove at least a portion of the oxide.

6. The method of claim 5, wherein the substrate is a gallium nitride (GaN) substrate.

7. The method of claim 5, wherein the substrate is a patterned sapphire substrate.

8. The method of claim 5, wherein the oxide comprises gallium oxide.

9. The method of claim 5, further comprising photochemically treating at least a portion of the wafer from which the oxide was removed.

10. The method of claim 5, wherein:
the wafer is an LED wafer; and
the depositing the Ohmic material on at least a portion of the n-type layer and the depositing a Schottky material on at least a portion of the buffer layer generates at least one SBD.

11. The method of claim 10, further comprising forming an interface layer on the substrate, the interface layer configured to increase a forward bias current density of at least one SBD.

* * * * *